(12) United States Patent
Suwa et al.

(10) Patent No.: US 7,528,473 B2
(45) Date of Patent: May 5, 2009

(54) ELECTRONIC CIRCUIT, A SEMICONDUCTOR DEVICE AND A MOUNTING SUBSTRATE

(75) Inventors: Motoo Suwa, Tokyo (JP); Yoshinori Miyaki, Tokyo (JP); Toru Hayashi, Tokyo (JP); Ryoichi Sano, Tokyo (JP); Shigezumi Matsui, Tokyo (JP); Takanobu Naruse, Tokyo (JP); Takashi Sato, Tokyo (JP); Hisashi Shiota, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 196 days.

(21) Appl. No.: 10/592,948

(22) PCT Filed: Mar. 19, 2004

(86) PCT No.: PCT/JP2004/003767

§ 371 (c)(1),
(2), (4) Date: Sep. 15, 2006

(87) PCT Pub. No.: WO2005/091367

PCT Pub. Date: Sep. 29, 2005

(65) Prior Publication Data

US 2007/0194433 A1    Aug. 23, 2007

(51) Int. Cl.
H01L 23/52        (2006.01)

(52) U.S. Cl. .................................... 257/681

(58) Field of Classification Search ......... 257/691–700, 257/734, E23.002
See application file for complete search history.

(56) References Cited

U.S. PATENT DOCUMENTS

| | | | | |
|---|---|---|---|---|
| 6,982,479 B2 * | 1/2006 | Nishijima et al. | ........... | 257/678 |
| 6,987,314 B1 * | 1/2006 | Yoshida et al. | .............. | 257/698 |
| 6,995,322 B2 * | 2/2006 | Chan et al. | .................. | 174/262 |
| 7,205,613 B2 * | 4/2007 | Fjelstad et al. | ............. | 257/355 |
| 7,205,646 B2 * | 4/2007 | Lin et al. | .................... | 257/686 |

FOREIGN PATENT DOCUMENTS

| | | |
|---|---|---|
| JP | 11-67970 | 3/1999 |
| JP | 2000-183173 | 6/2000 |
| JP | 2001-177046 | 6/2001 |
| JP | 2003-345480 | 12/2003 |
| WO | 99/24896 | 5/1999 |

* cited by examiner

*Primary Examiner*—Nathan W Ha
(74) *Attorney, Agent, or Firm*—Mattingly & Malur, PC

(57) ABSTRACT

An electronic circuit includes a first semiconductor device and a second semiconductor device on a mounting substrate. The mounting substrate lines have lengths which are made unequal for respective bits. Assembling lines which reach connecting electrodes of a semiconductor chip from the external terminals of the second semiconductor device have made lengths thereof unequal for respective bits. The unequal lengths of the mounting substrate lines have a relationship which offsets the unequal lengths of the assembling lines.

13 Claims, 34 Drawing Sheets

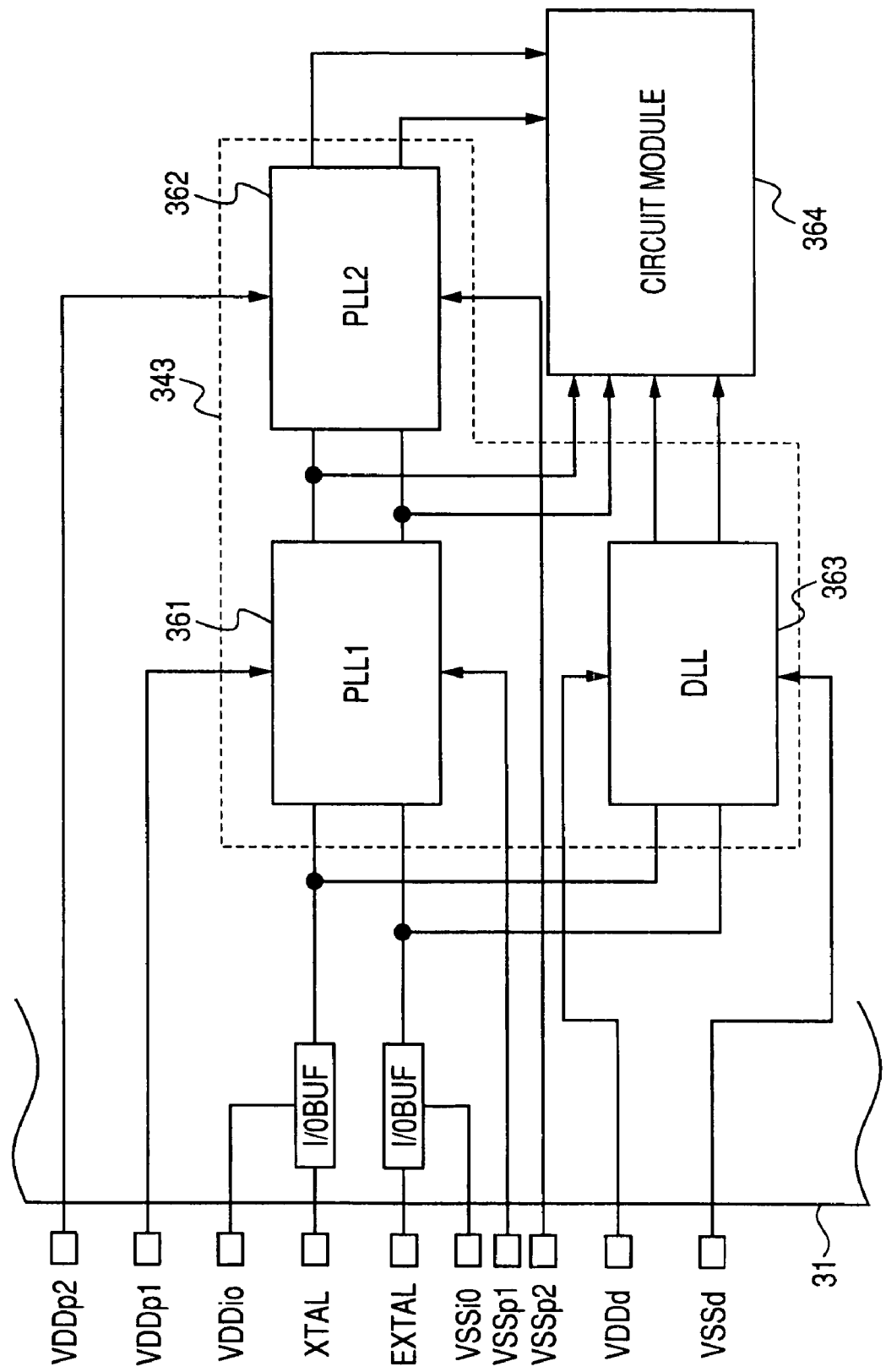

ELECTRONIC CIRCUIT, A SEMICONDUCTOR DEVICE AND A MOUNTING SUBSTRATE

TECHNICAL FIELD

The present invention relates to an electronic circuit in which a semiconductor device is mounted on a mounting substrate, a semiconductor device and a mounting substrate, and, for example, to a technique which is effectively applicable to a circuit module which mounts a data processor and an SDRAM (Synchronous Dynamic Random Access Memory), particularly DDR (Double Data Rate)-SDRAM (JEDEC STANDARD: JESD79) on a mounting substrate having the multi-layered wiring structure.

BACKGROUND ART

As a document which describes a circuit module which mounts a data processor and an SDRAM on a mounting substrate, there has been known Japanese Patent Laid-open 2001-177046. According to this document, the data processor having the BGA package structure is arranged at the center, the SDRAM is arranged around the data processor, and data terminals for the SDRAM are arranged at a center portion of a side of the BGA (Ball Grid Array) package. Output terminals of clocks, addresses and commands to the SDRAM are arranged at corner portions of the BGA package.

Further, in the international publication pamphlet of WO99/24896, there is a description with respect to wiring design which takes clock and address wiring at the time of connecting a microcomputer and a memory chip into consideration, wherein clock terminal is arranged at a center portion of a side of a package and addresses and data terminals are arranged on left and right sides of the clock terminal.

SUMMARY OF THE INVENTION

Inventors of the present invention have originally studied, in mounting a data processor having the BGA package structure and a SDRAM on a mounting substrate, the mounting substrate and the package structure which can exhibit operational performances thereof at maximum.

The inventors have firstly studied the reduction of a skew between bits of parallel data. Conventionally, as also described in the above-mentioned Japanese Patent Laid-open 2001-177046, there has been proposed a case in which to reduce a delay of timing of a clock signal between a plurality of SDRAMs and a chip which outputs the clock signal to the SDRAMs, a means which makes lengths of clock lines of a printed wiring board as equal as possible is taken.

To further enhance performances of the semiconductor device, there has been a demand for further improvement of a data transmission speed of a memory interface between a data processor (microcomputer chip) and a memory chip which is controlled by the data processor and has a function of storing data of large capacity. As a memory interface specification which may realize the high-speed data transfer, a DDR-SDRAM interface specification has been known.

In the above-mentioned SDRAM interface, the equal-length property of clock lines which are outputted from the data processor is required. However, in the DDR-SDRAM interface specification, to realize the high-speed property of the interface, not only the equal-length property of the clock lines is to be satisfied, but also timing margins of data signals (DQ) which correspond to data strobe signals (DQS) which are outputted from respective memory chips are strictly restricted.

An external terminal of a plurality of bits of a synchronous memory has data input/output timing thereof synchronized with a clock signal, and the data processor acquires data outputted from the synchronous memory in synchronism with the clock signal (data strobe signal: DQS) which is outputted from the synchronous memory. The data processor makes use of the inputted clock signal as the data strobe signal (DQS). As shown in FIG. 41, also in the synchronous memory, with respect to the DDR-SDRAM interface specification which realizes the data transfer at a high rate by outputting data in synchronism with rise and fall of the clock, the equal-length property of DQ wiring for DQS wirings is also required. Further, in the DQ wiring, to ensure the high data transfer rate in the same manner, an extremely large number of lines are connected in parallel thus ensuring a wide bus width. In this manner, compared to the conditions which are requested to acquire the equal-length property of master clock signals which are outputted from the data processor (memory control chip) in the conventional SDRAM interface, to realize the DDR-SDRAM interface, the observance of the strict timing margins, that is, the strict equal-length property of the wiring is imposed on the large number of lines. To satisfy such a demand, the inventors have originally studied the constitutions which contribute to the further enhancement of the performance and the reduction of the cost by reviewing the whole system.

When external terminals are arranged in a plurality of rows as represented by the BGA package, in the inside of the semiconductor device, due to the difference in arrangement rows of terminals of the package, distances to terminals of the chip differ from each other and hence, to absorb this difference, lines in the inside of the package must be bent little by little so as to align the line lengths. In the same manner, when external terminals are arranged in a plurality of rows as represented by the BGA package, also with respect to lines on the mounting substrate, corresponding to the difference in arrangement rows of the external terminals of the package, to absorb the difference, lines must be bent little by little so as to align the line lengths. This technical concept of making the line lengths equal requires cumbersome processing in both of the semiconductor device and the mounting substrate and, at the same time, a wiring region is also increased.

The inventors have secondly studied the influence attributed to coupling noises on the package substrate having the multi-layered wiring structure. The inventors have found out that when the semiconductor chip is used in a state that a reference potential is inputted to the semiconductor chip from the outside, a level of the reference potential may particularly fluctuate due to the influence attributed to the coupling noises.

The inventors have thirdly studied the reduction of power sources and current routes on a ground plane due to a large number of penetration holes such as through holes formed annularly in the mounting substrate. That is, the inventors have found out the following. In the mounting substrate having the multi-layered wiring structure, from a viewpoint of shielding, the ground plane and a power source plane are interposed between signal wiring layers, and a large number of via holes and through holes which connect the signal wiring layers penetrate the ground plane and the power source plane in a non-contact state. In the package structure which is represented by the BGA package structure, solder ball electrodes are arranged annularly in plural rows. Further, the solder ball electrodes are arranged at a narrow pitch. Accordingly, it is expected that non-contact penetration holes such as the via holes and the through holes may be formed in the ground plane and the power source plane and hence, the current route between an outer peripheral portion and an inner peripheral portion of the annular penetration holes becomes substantially narrow whereby it is impossible to obtain a required current supply ability.

The inventors have fourthly studied the terminating processing of lines which supply commands and addresses to a plurality of SDRAMs. The inventors have found out that such a line is a one-way line having a branched portion in a middle portion thereof and a voltage-reflection-noise reduction effect differs depending on which one of destinations after branching is to be terminated. Further, since the commands and the addresses are formed of a signal of a plurality of bits, it is desirable to arrange the terminating resistance with respect to a terminating power source plane to stabilize a terminating power source. By taking this understanding into consideration, the inventors have found out the necessity of determining which one of destinations after branching of the one-way line is to be terminated.

The inventors have fifthly studied another influence attributed to the coupling noises on the package substrate having the multi-layered wiring structure. The inventors have found that when the semiconductor chip includes a phase locked loop (PLL) circuit or a delay locked loop (DLL) circuit, due to coupling of clock lines used for operations of the circuits and operational power source lines of the PLL circuit or the DLL circuit on the package substrate, the power source is fluctuated thus giving rise to a possibility that the synchronizing performance is lowered.

The inventors have sixthly studied power source lines for a digital/analogue converter (DAC) or an analogue/digital converter (ADC) on the package substrate. The inventors have found that when levels of the power source lines for the DAC or the ADC fluctuate even in a state that the power source liens for the DAC or the ADC are independently formed from power source lines for other circuits, here exists a necessity of enhancing the conversion accuracy by suppressing the influence of the DAC or the ADC on the signals.

The inventors have seventhly studied the DAC having a circuit which adds a constant current from a constant current source circuit to an output node using a switch. The inventors found the necessity of enhancing the conversion accuracy by preventing the switching noises attributed to the switches from influencing the power source of the constant current power circuit.

It is the first object of the present invention to reduce a skew between bits of parallel data on a mounting substrate without spending times and efforts for processing and without increasing a wiring region compared to making wiring lengths equal to each other.

It is the second object of the present invention to suppress the influence of coupling noises on a reference potential on a package substrate having the multi-layered wiring structure.

It is the third object of the present invention to suppress the reduction of a current route attributed to the influence of via holes and through holes which penetrate a power source plane and a ground plane of the mounting substrate.

It is the fourth object of the present invention to enhance the terminal performance of a one-way line which has a branched portion in a middle portion thereof on a mounting substrate.

It is the fifth object of the present invention to suppress a phenomenon that clock wiring which a PLL circuit or a DLL circuit of a semiconductor chip and an operational power source line are coupled to each other on a package substrate and the power source is fluctuated thus lowering the synchronizing performance.

It is the sixth object of the present invention to enhance the conversion accuracy by suppressing the influence on a DAC or an ADC of a semiconductor chip on a package substrate even when a level of a power source line for the DAC or the ADC is fluctuated.

It is the seventh object of the present invention to enhance the conversion accuracy by, in a semiconductor device which is of a type in which a constant current from a constant current source circuit is added to an output node using a switch and includes a DAC, preventing power source noises attributed to switching of the switch from influencing a power source of the constant current source circuit.

The above-mentioned and other objects and novel features of the present invention will become apparent by the description of this specification and attached drawings.

To briefly explain the summary of typical inventions among inventions disclosed in the present application, they are as follows.

[1] <<Reduction of Skew Between Bits of Parallel Data>>

An electronic circuit according to the present invention includes a first semiconductor device (4) and a second semiconductor device (3) on a mounting substrate (2). The above-mentioned mounting substrate includes a plurality of mounting substrate lines (201 to 204) which are connected in common with external terminals (DQ0 to DQ3) of a plurality of bits of the first semiconductor device and external terminals (351 to 354) of a plurality of bits of the second semiconductor device for every bit. The mounting substrate lines have lengths thereof from the external terminals of the first semiconductor device to the external terminals of the second semiconductor device made unequal for respective bits. Assembling lines (361 to 364) which reach connecting electrodes of a semiconductor chip (31) from the external terminals of the second semiconductor device have made lengths thereof unequal for respective bits. Here, the unequal lengths of the mounting substrate lines have a relationship which offsets the unequal lengths of the assembling lines. According to such a constitution, it is unnecessary to set lengths between the external terminals of the second semiconductor device and the connecting electrodes of the semiconductor chip equal. In designing and manufacturing the mounting substrate which mounts the semiconductor device thereon, the lines which connect the first semiconductor device and the second semiconductor device may be made unequal on the mounting substrate such that the unequal lengths are offset from each other in accordance with contents of the unequal lengths of the semiconductor device. Accordingly, at least, in the inside of the second semiconductor device, it is unnecessary to bend middle portions of the respective lines or align the respective lines with each other for making the respective lines have the equal length on the mounting substrate.

According to a specific mode of the present invention, the first semiconductor device is formed of a synchronous memory, the second semiconductor device is formed of a data processor which is capable of getting access to and controlling the synchronous memory, and the data processor performs parallel inputting/outputting of access data of a plurality of bits between the data processor and the synchronous memory via the mounting substrate lines. It is possible to reduce the skew between bits of the parallel access data without increasing the wiring region and without cumbersomeness.

The external terminal of a plurality of bits of the synchronous memory has data inputting/outputting timing thereof synchronized with the clock signal, and the data processor acquires data outputted from the synchronous memory in synchronism with the above-mentioned clock signal (DQS) which is outputted from the synchronous memory. The data processor uses the clock signal inputted to the data processor as a data strobe.

According to another specific mode of the present invention, the second semiconductor device includes the BGA package structure in which a large number of solder ball electrodes are formed on the package substrate as external terminals, wherein unequal lengths of the assembling lines in the inside of the package substrate depend on the distance from a periphery of the package among the solder ball electrodes. That is, when the solder ball electrodes are annularly arranged in plural rows and the synchronous memory is arranged to face a side of the package substrate, the unequal lengths of the assembling lines in the inside of the package substrate become integer times as large as a pitch in the row direction of the solder ball electrodes. Corresponding to the setting of the unequal lengths, the mounting substrate lines on the mounting substrate may be set to unequal lengths based on the difference of integer times of the pitch in the row direction. The significance of the unequal lengths is collectively grasped as a common concept that the unequal lengths are integer times as large as the pitch in the row direction of the solder ball electrodes in both of the semiconductor device and the mounting substrate.

In the specific mode of the present invention, the first semiconductor device has lengths of the assembling lines thereof from the external terminals thereof to connection electrodes of the semiconductor chip made equal to each other. Also when the lengths of the assembling lines thereof from the external terminals thereof to connection electrodes of the semiconductor chip are unequal, the unequal lengths of the mounting substrate lines may be determined by taking the unequal lengths into consideration.

[2] <<Vref Wiring>>

According to another aspect of the present invention, in the semiconductor device of the present invention, the semiconductor chip (31) is mounted on the package substrate (30). The semiconductor chip includes a determination circuit (399) which performs a determination operation using a reference potential supplied from a predetermined pad electrode. The package substrate includes a first conductive layer (Lp1) which is used for the connection with the pad electrodes of the semiconductor chip, a second conductive layer (Lp2) which is used as a ground plane, a third conductive layer (Lp3) which is used as a power source plane, and a fourth conductive layer (Lp4) which is used for the connection with the mounting substrate. The third conductive layer includes a power source plane (38e) which is connected with the determination circuit and lines (38g) for the reference potential, wherein the lines for the reference potential are arranged in a state that the lines for the reference potential are surrounded by the power source plane. Due to such a constitution, when a level of the power source plane of the determination circuit fluctuates, the reference potential which is coupled to the level of the power source plane tends to be changed with a same phase correspondingly and hence, the constitution contributes for the prevention of an erroneous operation by the determination circuit.

Further, by arranging the second conductive layer between the first conductive layer and the third conductive layer, the power source plane of the determination circuit is shielded from signal lines of the determination circuit by the ground plane and hence, the reliability of the determination operation by the determination circuit is further increased.

[3] <<Prevention of Separation of VCC(VSS) Plane on Mounting Substrate>>

According to another aspect of the present invention, an electronic circuit of the present invention includes a semiconductor device (3) on a mounting substrate (2). The mounting substrate includes a first conductive layer (Lm1) on which a wiring pattern is formed, a second conductive layer (Lm2) which is used as a ground plane, a third conductive layer (Lm3) which is used as a power source plane, and a fourth conductive layer (Lm4) on which a wiring pattern is formed. For example, external terminals of the semiconductor device are joined to the wiring pattern of the first conductive layer, a ground wiring pattern of the first conductive layer is joined to a ground plane of the second conductive layer through via holes or through holes (35B), a power source wiring pattern of the first conductive layer is joined to the power source plane through via holes or through holes (35C) which penetrate the second conductive layer, a predetermined signal wiring pattern of the first conductive layer is joined to a wiring pattern of the fourth conductive layer through via holes or through holes (35A) which penetrate the second conductive layer and the third conductive layer. The ground plane and the power source plane include specified regions (213, 223) where the via holes or the through holes are not formed in a penetrating manner, and the specified regions have a width equal to or larger than one pitch of the external terminals arranged on the semiconductor device. Due to such a constitution, it is possible to prevent a phenomenon that a large number of non-contact penetration holes such as via holes and through holes are annularly formed in the ground plane or the power source plane and a current route defined between an outer peripheral portion and an inner peripheral portion of the annular penetration holes becomes substantially narrow. In other words, it is possible to prevent the ground plane and the power source plane from being separated into the inside and the outside with respect to the current supply ability.

In the specific mode of the present invention, the specified region of the ground plane has joining portions with the via holes or the through holes which are connected with the ground wiring pattern of the first conductive layer. Further, the specified region of the power source plane has joining portions with the via holes or the through holes which are connected with the power source wiring pattern of the first conductive layer. Due to such a constitution, it is possible to increase a current which flows into the specified regions.

In the specific mode of the present invention, the specified regions are positioned in the vicinity of corner portions of the rectangular semiconductor device. To take the reduction of the skew between bits into consideration, it is desirable to arrange the terminals of the parallel data at portions of sides of the semiconductor device and hence, to carry out the above-mentioned prevention of separation of the power source plane and the ground plane at the corner portions does not compete such a request in view of place.

In another specific mode of the present invention, the semiconductor device includes the BGA package structure in which a large number of solder ball electrodes are annularly arranged in a plurality of rows on the package substrate. The wiring pattern of the first conductive layer includes annularly arranged lands to which the solder ball electrodes are connectable in a plurality of rows, and the via holes or the through holes which are connected to the ground plane or the via holes or the through holes which are connected to the power source plane are arranged outside an outer peripheral portion or the inside of the inner peripheral portion of the region where the lands are annularly formed. Due to such a constitution, it is possible to uniformly supply the potential to the ground plane and the power source plane.

To grasp the present invention from a viewpoint of the mounting substrate, the mounting substrate on which the semiconductor device is mounted includes the first conductive layer on which the wiring pattern having the lands to which the external terminals of the semiconductor device are connectable, the second conductive layer which is exclusively used on the ground plane, the third conductive layer which is exclusively used on the power source plane, and the fourth conductive layer on which the wiring pattern is formed. For example, the ground wiring pattern of the first conductive layer is joined to the ground plane via the via holes or the through holes, the power source wiring pattern of the first conductive layer is joined to the power source plane via the via holes or the through holes which penetrate the second conductive layer, and the predetermined signal wiring pattern of the first conductive layer is joined to the wiring pattern of the fourth conductive layer via the via holes or the through holes which penetrate the second conductive layer and the third conductive layer. The ground plane and the power source plane have specified regions of the lands where the via holes or the through holes do not penetrate at a width of 1 pitch or more.

[4] <<Terminating Processing of One-Way Wiring Having Branch]

According to another aspect of the present invention, an electronic circuit of the present invention includes a plurality of semiconductor memory devices and a semiconductor control device which is capable of getting access to and controlling the semiconductor memory devices on the mounting substrate. The mounting substrate includes a power source plane (51) of a terminating power source for terminating lines which connect the semiconductor memory devices and the semiconductor control device by way of terminating resistances. The semiconductor memory devices are mounted closer to the power source plane of the terminating power source than the semiconductor control device. To the power source plane of the terminating power source, terminating resistances (52, 53) which are connected with the above-mentioned lines and a plurality of first stabilizing capacities (54) which are arranged close to the terminating resistances are connected in a dispersed manner. With respect to the power source plane of the terminating power source, a second stabilizing capacity (56) which is larger than the first stabilizing capacities is connected to an end portion of the power source plane remote from the supply end which supplies the terminating power source. The first stabilizing capacities compensate for potential changes in the vicinity of terminating resistances. The second stabilizing capacity compensates for a potential change at the remote end of the power source plane of the terminating power source.

In a specific mode of the present invention, the power source plane of the terminating power source has a shape which includes rectangular corner portions in the rectangular mounting substrate, the supply end of the terminating power source is arranged in the vicinity of the rectangular corner portion, and the power source plane of the terminating power source extends toward both sides of the supply end (55) of the terminating power source. To take the reduction of the skew between bits into consideration, it is desirable to arrange the terminals of the parallel data at portions of sides of the semiconductor device and hence, to arrange the power source plane of the terminating power source which supplies the terminating power source to the semiconductor device at the corner portions does not compete such a request in view of place.

In another specific mode of the present invention, the inventors focus on one-way line (50) to which a plurality of semiconductor memory devices are connected in common and has a branch as the above-mentioned line to be subjected to the terminating processing. The one-way line having the branch is, for example, a line which transmits commands and addresses to the plurality of semiconductor memory devices from the semiconductor control device. When the best priorities assigned to the suppression of the voltage reflection attributed to the termination of a signal, it is preferable that the one-way line having the branch has the terminating resistance thereof joined to a route having a longer route length starting from the semiconductor control device. Since the shorter route is regarded as a concentrated constant capacity, the shorter route may preferably be as short as possible.

As another mode, since the commands and addresses are formed of a signal of plural of bits, it is desirable to arrange the terminating resistances in a dispersed manner with respect to the terminating power source plane for stabilizing the terminating power source. To take this arrangement into consideration, it is not always best to join all terminating resistances to the longer route. Accordingly, among the above-mentioned lines, the one-way lines having the branch to which the plurality of semiconductor memory devices are connected in common, include lines (L1 to L4, L7, L8) which have terminating resistances thereof joined to the route having the longer route length starting from the semiconductor control device and lines (L5, L6) which have terminating resistances thereof joined to the shorter route. A maximum value of the difference of the route length between the longer route in the one-way line which has the terminating resistance thereof joined to the shorter route and the shorter route is set to a minimum value or less of the difference of the route length between the shorter route in the one-way line which has the terminating resistance thereof joined to the longer route and the longer route. Due to such a constitution, it is also possible to minimize the influence attributed to the voltage reflection by taking the dispersed arrangement of the terminating resistances with respect to the terminating power source plane into consideration.

[5] <<PLL/DLL Clock Wiring>>

According to another aspect of the present invention, in the semiconductor device of the present invention, the semiconductor chip is mounted on the package substrate, the semiconductor chip includes the phase locked loop (PLL) circuit or the delay locked loop (DLL) circuit, and the package substrate includes the first conductive layer which is used for connection with the pad electrodes of the semiconductor chip. The first conductive layer includes the power source line (380) which supplies the power source to the PLL circuit or the DLL circuit, and the clock lines (381, 382) which supply clock signals to the PLL circuit or the DLL circuit, wherein the power source line and the clock line are spaced apart from each other with a distance larger than a minimum distance sizes of the lines in the first conductive layer. Due to such a constitution, it is possible to suppress a situation that the clock line which the PLL circuit or the DLL circuit of the semiconductor chip uses and an operational power source line of the PLL circuit or the DLL circuit are coupled to each other on the package substrate thus preliminarily preventing a possibility that the operational power source of the PLL circuit or the DLL circuit fluctuates attributed to coupling noises which are synchronized with the oscillation cycle of the clock and lowers the synchronized performance. This is because that, for example, a voltage control oscillator or a current control oscillator which is largely influences the synchronized performance in the PLL circuit or the DLL circuit, when the operational power source thereof fluctuates, fluctuates the oscillation frequency thereof.

As a specific mode of the present invention, the package substrate includes a second conductive layer which is used as the ground plane exclusively, and a third conductive layer which is used as the power source plane exclusively, wherein the power source line which supplies the power source to the PLL circuit or the DLL circuit on the third conductive layer is arranged independent from other power source planes. This provision is adopted to prevent the influence of the power source noises attributed to operations of other circuits.

[6] <<Independent Power Source Plane for DAC/ADC>>

According to another aspect of the present invention, in the semiconductor device of the present invention, the semiconductor chip is mounted on the package substrate, the semiconductor chip includes converters of either one or both of a digital analog converter (DAC) and an analog digital converter (ADC), and the package substrate includes a first conductive layer which is used for connection with pad electrodes of the semiconductor chip, a second conductive layer which is used as the ground plane, a third conductive layer which is used as the power source plane, and a fourth conductive layer which is used for connection with the mounting substrate. On the third conductive layer, power source planes (396A, 397A) for the converters are separated from the power source plane (38C) of-other circuits. Further, on the first conductive layer, signal lines for converters (398a, 398b) are formed at positions where the signal lines for converters (398a, 398b) are overlapped to the power source plane for the converters. Due to such a constitution, even when the power source plane for the DAC or the ADC on the package substrate are arranged independently from the power source planes of other circuits, when the power source plane for the DAC or the ADC fluctuates, the signal lines for converters which are coupled to the power source plane tend to change levels thereof on the same phase and hence, the lowering of the conversion accuracy attributed to the fluctuation of the power source of the converter can be suppressed as much as possible.

As a specific mode of the present invention, provided that the converter includes a circuit which adds a constant current from a constant current source circuit to an output node via a switch (391), the power source plane for converter (396A) which is formed on the third conductive layer (Lp3) is assumed as the power source plane of the constant current source circuit (390), and the power source plane (395A) of the circuit (392) which controls the switch (391) is formed on the fourth conductive layer (Lp4) separately from the power source plane of the constant current source circuit. Accordingly, it is possible to prevent the switching noises of the switch from influencing the power source of the constant current source circuit thus contributing to the enhancement of the conversion accuracy. To obtain this advantageous effect in a more reliable manner, the power source plane for converter which is formed on the third conductive layer and the power source plane of the circuit for controlling the switch which is formed on the fourth conductive layer may be separately joined to connection end terminals to the mounting substrate which are electrically separated from each other on the fourth conductive layer.

[7] <<Separation of Power Source of Constant Current Source Circuit in DAC>>

According to another aspect of the present invention, in the semiconductor device of the present invention, the semiconductor chip is mounted on the package substrate, the semiconductor chip includes a DAC (334), and the package substrate includes a first conductive layer which is used for connection with pad electrodes of the semiconductor chip, a second conductive layer which is used as the ground plane, a third conductive layer which is used as the power source plane, and a fourth conductive layer which is used for connection with the mounting substrate. The above-mentioned DAC includes a circuit which adds a constant current from the constant current source circuit (390) to an output node using a switch (391). The semiconductor chip (31) includes a first analog power source terminal (VCCA) and a first analog ground terminal (VSSA) for the constant current source circuit and a second analog power source terminal (VCCA1) and a second analog ground terminal (VSSA1) for the switch control circuit (392) respectively in a separated manner. The first analog ground terminal and the second analog ground terminal are connected to analog grounding lines (393, 394) which are separately formed on the first conductive layer, and the respective analog ground lines are connected to the ground plane of the second conductive layer in common. The first analog power source terminal and the second analog power source terminal are separately connected to terminals of the fourth conductive layer from the respectively intrinsic analog power source lines (395, 396) which are formed on the first conductive layer via the respective power source planes (395A, 396A). Due to such a constitution, it is possible to prevent the switching noises of the switches from influencing the power source of the constant current source circuit thus contributing to the enhancement of the conversion accuracy.

BRIEF DESCRIPTION OF THE DRAWINGS

FIG. 32 is a block diagram showing one example of a CPG.

BEST MODE FOR CARRYING OUT THE INVENTION

<<Summary of Mounting Substrate and a Package Structure of an Electronic Circuit>>

Figure 1:
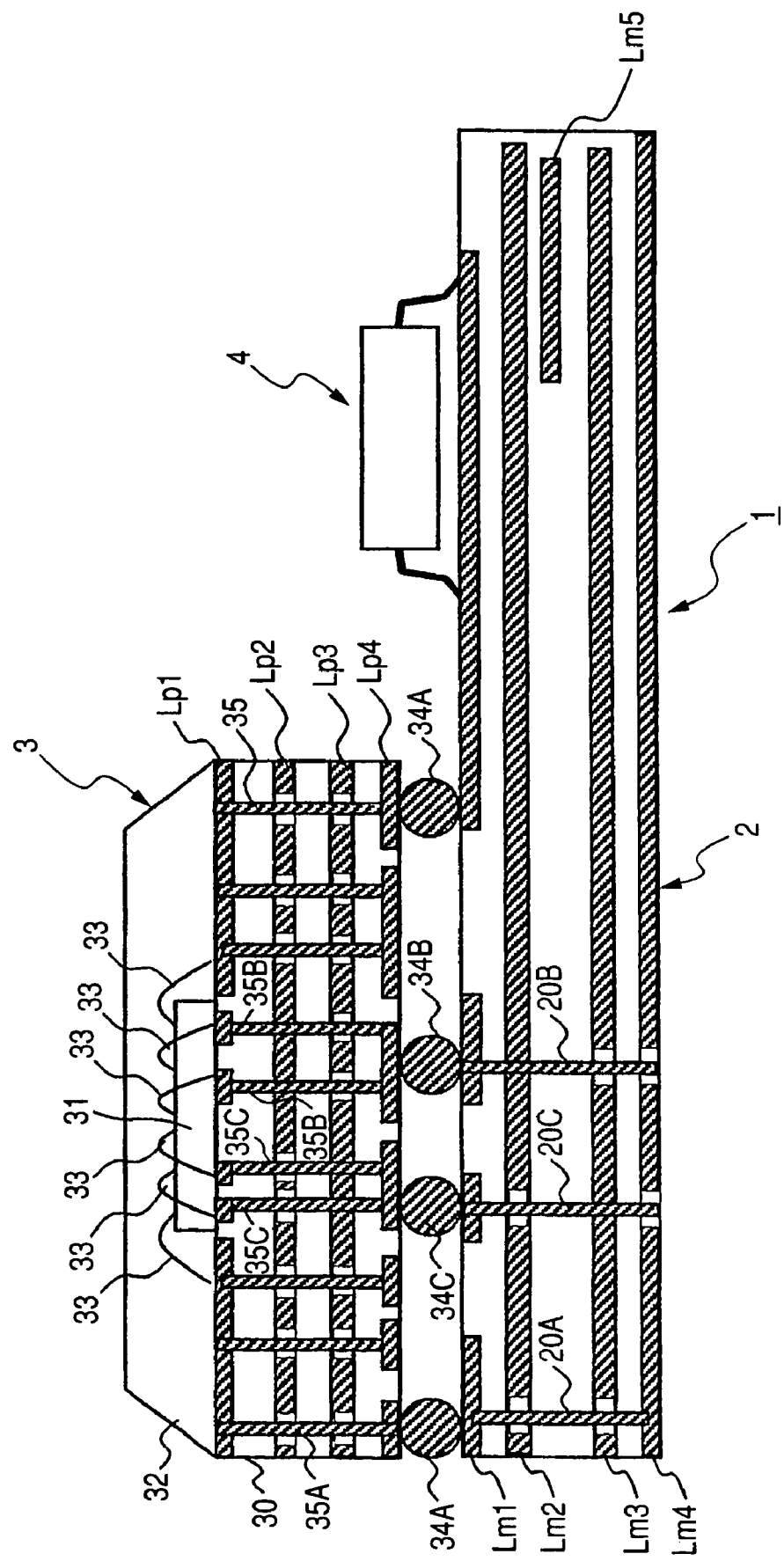
FIG. 1 is a schematic cross-sectional view showing a longitudinal cross-sectional structure of an electronic circuit according to the present invention.

FIG. 1 shows one example of an electronic circuit according to the present invention. An electronic circuit 1 shown in the FIG. 1 includes a data processor 3 which constitutes a first semiconductor device and a SDRAM 4 which constitutes a second semiconductor device on a mounting substrate 2. Although not particularly shown in the drawing, a plurality of SDRAMs 4 is mounted on the mounting substrate 2.

The data processor 3 includes a package substrate 30 which has the BGA package structure, for example, and a processor chip 31 which is mounted on the package substrate 30, wherein a surface of the data processor 3 is protected by a sealing resin 32. Although not particularly limited, the SDRAM 4 is constituted by sealing a SDRAM chip in a flat package such as a SOP (Small Outline Package). The processor chip 31 and the SDRAM chip not shown in the drawing are, although not particularly limited, formed on one semiconductor substrate made of mono-crystalline silicon or the like using a complementally MOS (CMOS) integrated circuit manufacturing technique.

The package substrate 30 has the multi-layered printed wiring board structure and includes, on an insulating substrate which uses glass fiber cloth, for example, as a base material and impregnates an epoxy resin therein, a first conductive layer Lp1 on which lines which are used for connection with pad electrodes of the processor chip 31 and the like are formed, a second conductive layer Lp2 which is used as a ground plane, a third conductive layer Lp3 which is used as a power source plane, and a fourth conductive layer Lp4 on which lines which are used for connection with the mounting substrate 2 are formed. Joining of bonding pads of the processor chip 31 and corresponding lines of the first conductive layer Lp1 is performed using bonding wires 33 which are indicated in a representing manner. On the lines of the fourth conductive layer Lp4, solder ball electrodes 34A to 34C which are indicated as solder ball electrodes in a representing manner are arranged, and these solder ball electrodes 34A to 34C are used for joining with the corresponding lines of the mounting substrate 2.

To establish the inter-layer connection of lines of the conductive layers Lp1 to Lp4, through holes or via holes (also simply referred to as "via") which apply conductive plating on inner surfaces thereof are used. The via 35A which is shown in a representing manner penetrates the ground plane of the second conductive layer Lp2 and the power source plane of the third conductive layer Lp3 in a non-contact state and makes a predetermined signal line of the first conductive layer Lp1 conductive with the corresponding solder ball electrode 34A via a predetermined signal line of the fourth conductive layer Lp4. The via 35B which is shown in a representing manner makes a ground line of the first conductive layer Lp1 conductive with the ground plane of the second conductive layer Lp2 and, at the same time, penetrates the power source plane of the third conductive layer Lp3 in a non-contact state and makes a predetermined line of the fourth conductive layer Lp4 conductive with the solder ball 34B via predetermined line of the fourth conductive layer Lp4. The via 35C which is shown in a representing manner penetrates the ground plane of the second conductive layer Lp2 in a non-contact state, connects the power source line of the first conductive layer Lp1 to the power source plane of the third conductive layer Lp3, and makes the power source line of the first conductive layer Lp1 conductive with the solder ball electrode 36C via a predetermined line of the fourth conductive layer Lp4.

The mounting substrate 2 has the multi-layered printed wiring board structure and includes, on an insulating substrate which uses glass fiber cloth, for example, as a base material and impregnates an epoxy resin therein, a first conductive layer Lm1 which is provided for mounting the data processor 3, SDRAM 4 and the like thereon and on which a first-layer wiring pattern and the like are formed, a second conductive layer Lm2 which is used as a ground plane or the like, a third conductive layer Lm3 which is used as a power source plane or the like, a fourth conductive layer Lm4 on which a second-layer wiring pattern and the like are formed, and a fifth conductive layer Lm5 which is used as a terminating power source plane of the SDRAM 4. To establish the inter-layer connection of lines of the conductive layers Lm1 to Lm5, through holes or via holes (also simply referred to as "via") which apply conductive plating on inner surfaces thereof are used. The via 20A which is shown in a representing manner penetrates the ground plane of the second conductive layer Lm2 and the power source plane of the third conductive layer Lm3 in a non-contact state and makes a predetermined signal line of the first conductive layer Lm1 conductive with a predetermined signal line of the fourth conductive layer Lm4. The via 20B which is shown in a representing manner makes a ground line of the first conductive layer Lm1 conductive with the ground plane of the second conductive layer 202 and, at the same time, penetrates the power source plane of the third conductive layer Lm3 and the wiring of the fourth conductive layer Lm4 in a non-contact state. The via 20C which is shown in a representing manner penetrates the ground plane of the second conductive layer Lm2 and the wiring of the fourth conductive layer Lm4 in a non-contact state and connects the power source line of the first conductive layer Lm1 with the power source plane of the third conductive layer Lm3.

Figure 2:
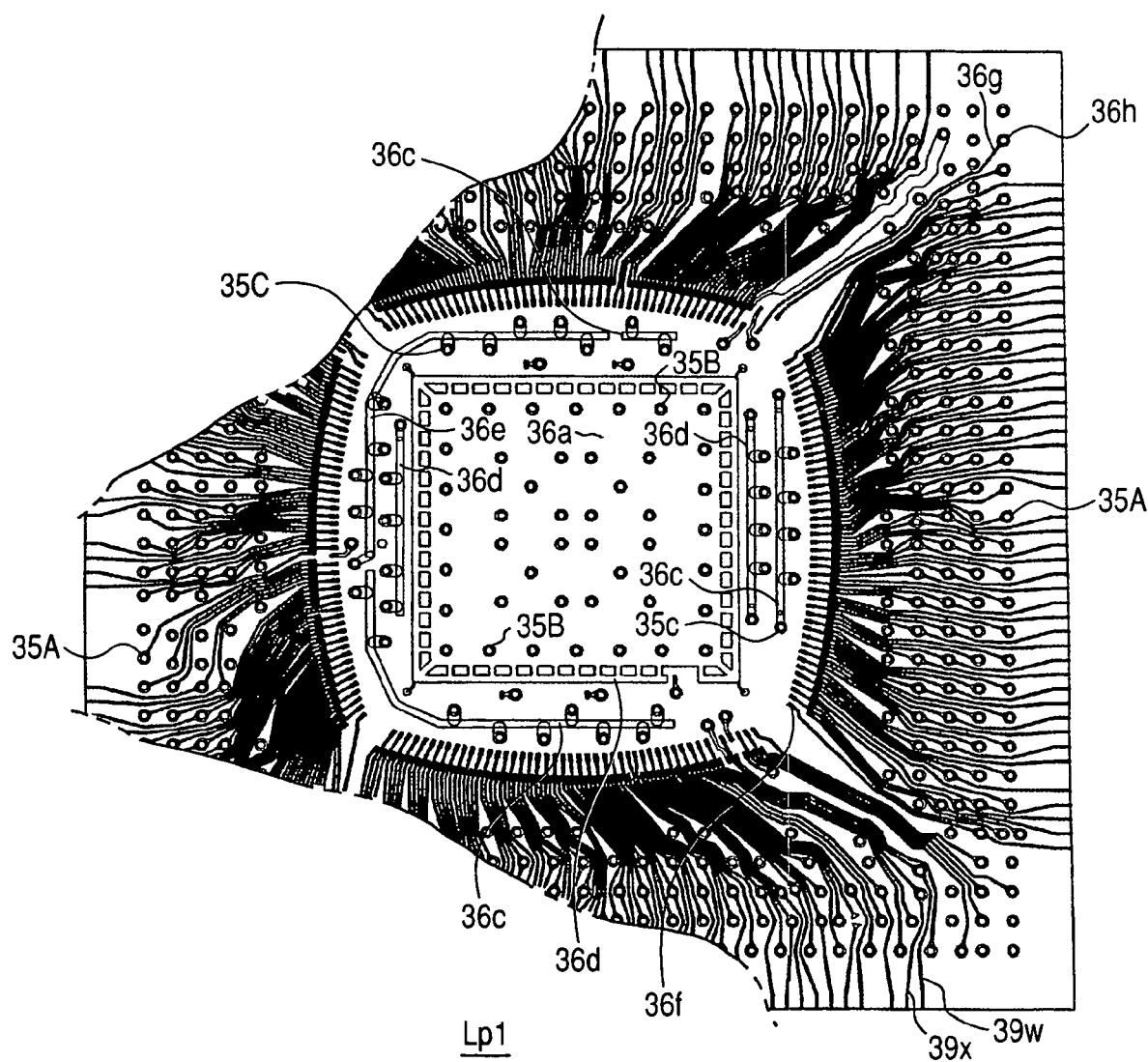
FIG. 2 is a plan view showing a planner pattern constitution of a first conductive layer Lp1 on a package substrate.

FIG. 2 shows a planner pattern constitution of the first conductive layer Lp1 on the package substrate 30. The processor chip 31 is mounted on a portion which is indicated by numeral 36a. Portions which are indicated by numeral 36b define regions which are bonded to bonding pads of the processor chip 31 having a ground potential by wire bonding. Portions which are indicated by numerals 36c, 36d, 36e and the like define regions which are bonded to bonding pads of the processor chip 31 having a plural kinds of power source voltages by wire bonding. A portion indicated by numeral 36f defines a region which is bonded to bonding pads of the processor chip 31 intrinsic to various signals by wire bonding. Numeral 36g indicates a signal line, and numeral 36h indicates regions where the vias pass through. Lines which are indicated by 39w, 39x are lines (plating power supply lines) for supplying a cathode potential to the bonding pads 365 at the time of applying electrolytic gold plating to the bonding pads 365 of the package substrate.

Figure 3:
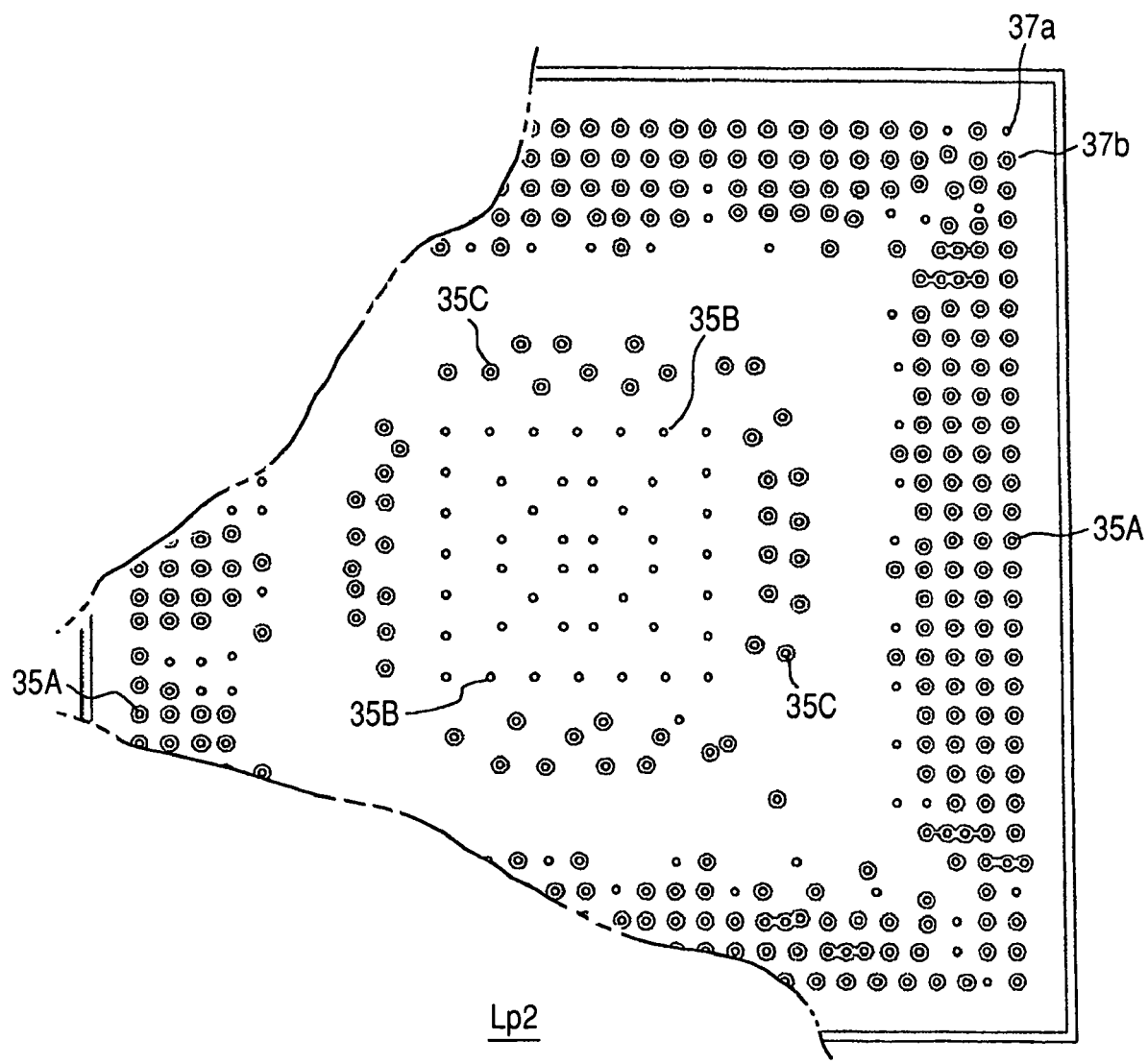
FIG. 3 is a plan view showing a planner pattern constitution of a second conductive layer Lp2 on the package substrate.

FIG. 3 shows a planner pattern constitution of the second conductive layer Lp2 on the package substrate 30. A ground potential supply pattern is formed on the substantially whole surface of the second conductive layer Lp2. Numeral 37a indicates regions where the vias penetrate the second conductive layer Lp2 in an electrically contact state, while numeral 37b indicates regions where the vias penetrate the second conductive layer Lp2 in an electrically non-contact state.

Figure 4:
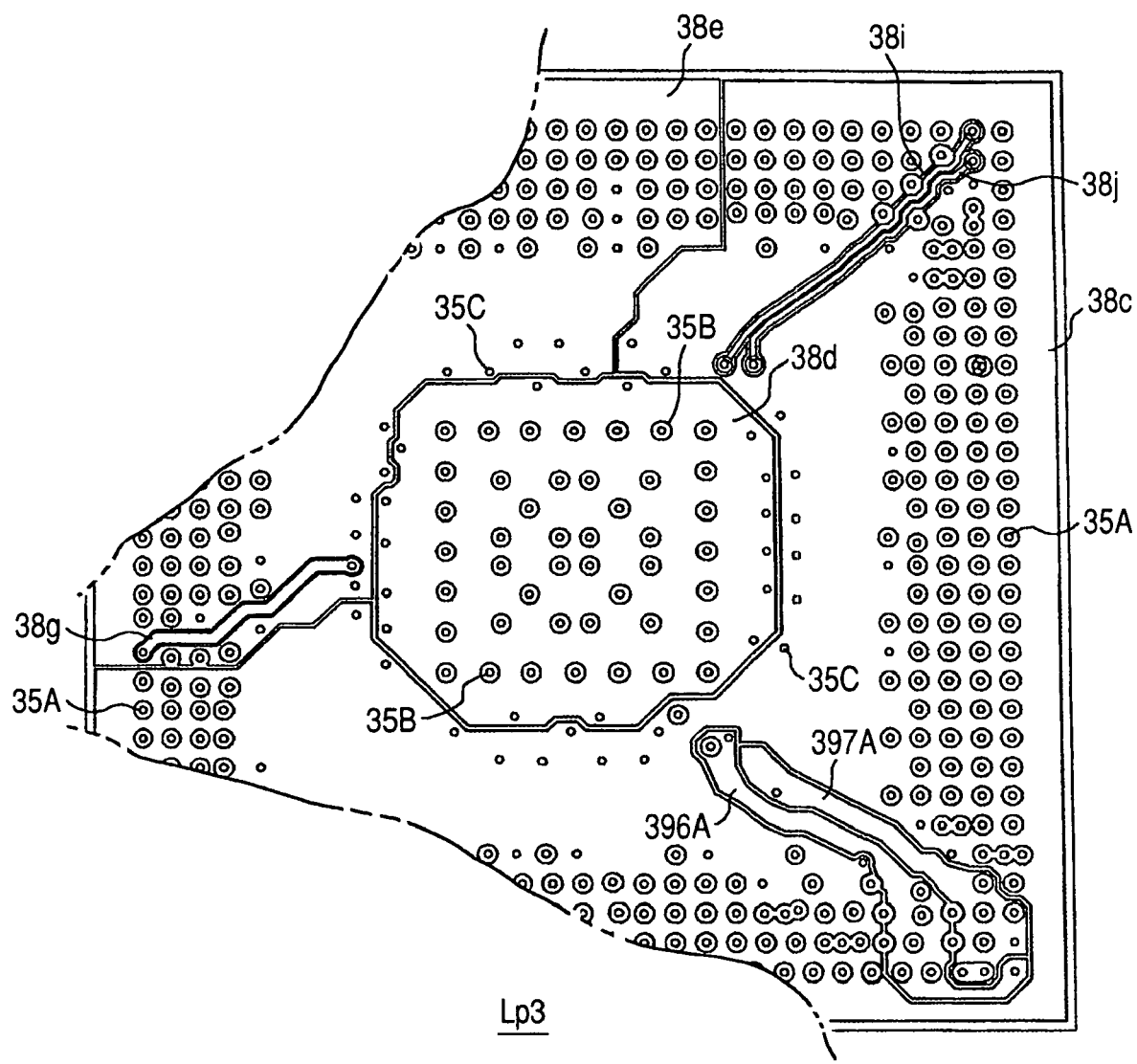
FIG. 4 is a plan view showing a planner pattern constitution of a third conductive layer Lp3 on the package substrate.

FIG. 4 shows a planner pattern constitution of the third conductive layer Lp3 on the package substrate 30. A power source voltage of the processor chip 31 may be, although not particularly limited, an external interface power source having a voltage of approximately 3.3V, an interface power source with the SDRAM having a voltage of approximately 2.5V or a digital internal circuit (core) power source having a voltage of approximately 1.2V. Numeral 38c indicates a region for the external interface power source, numeral 38e indicates a region for an interface power source with the SDRAM, and numeral 38d indicates a region for a digital core power source.

Figure 5:
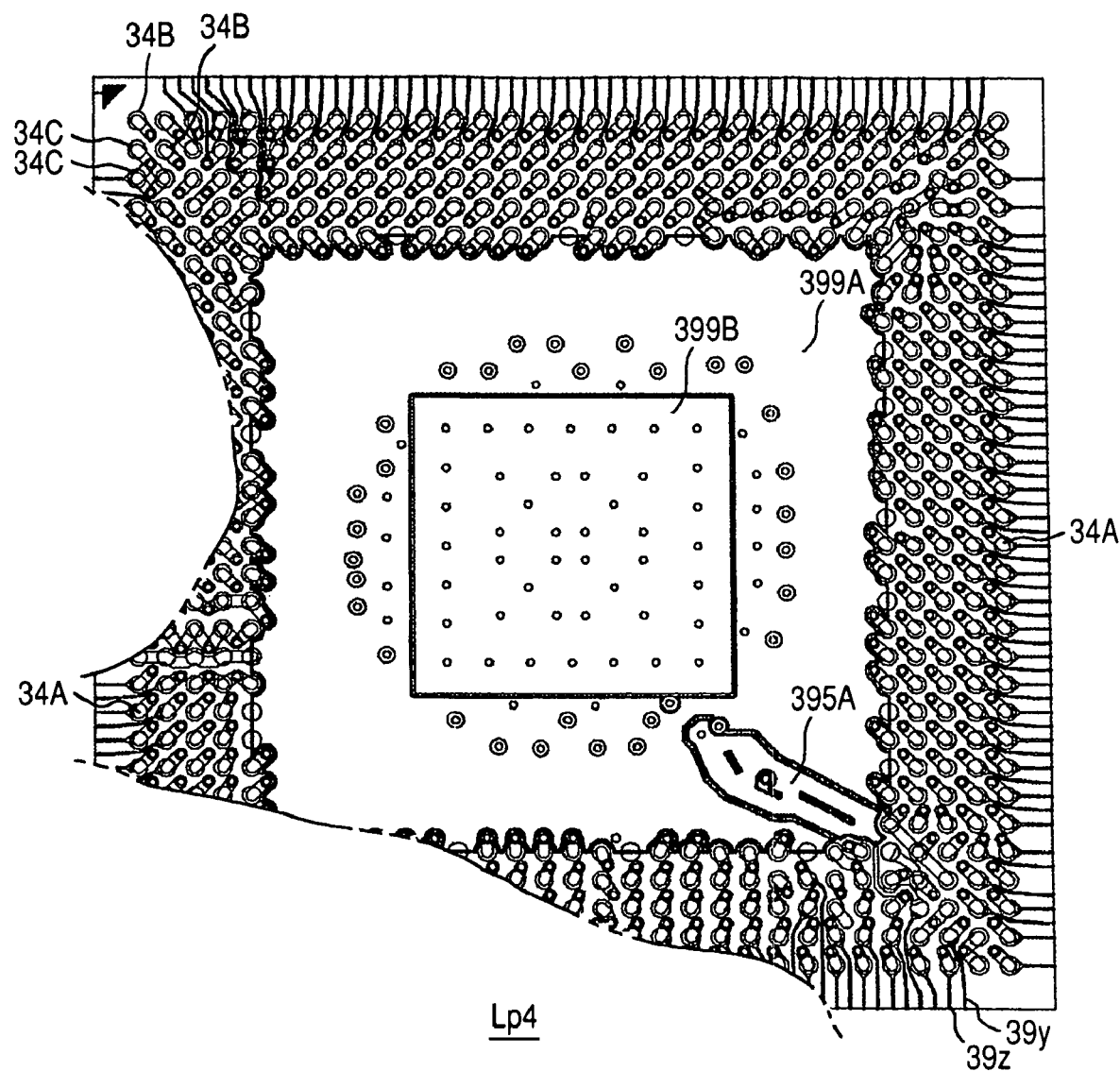
FIG. 5 is a plan view showing a planner pattern constitution of a fourth conductive layer Lp4 on the package substrate.

FIG. 5 shows a planner pattern constitution of the fourth conductive layer Lp4 on the package substrate 30. Lines which are indicated by numerals 39y, 39z constitute plating power supply lines for applying electrolytic gold plating to the bonding pads 365 on the package substrate. In FIG. 5, a conductive pattern indicated by 399A for a digital core power source. Further, a conductive pattern indicated by 399B is a pattern for supplying ground potential.

Figure 6:
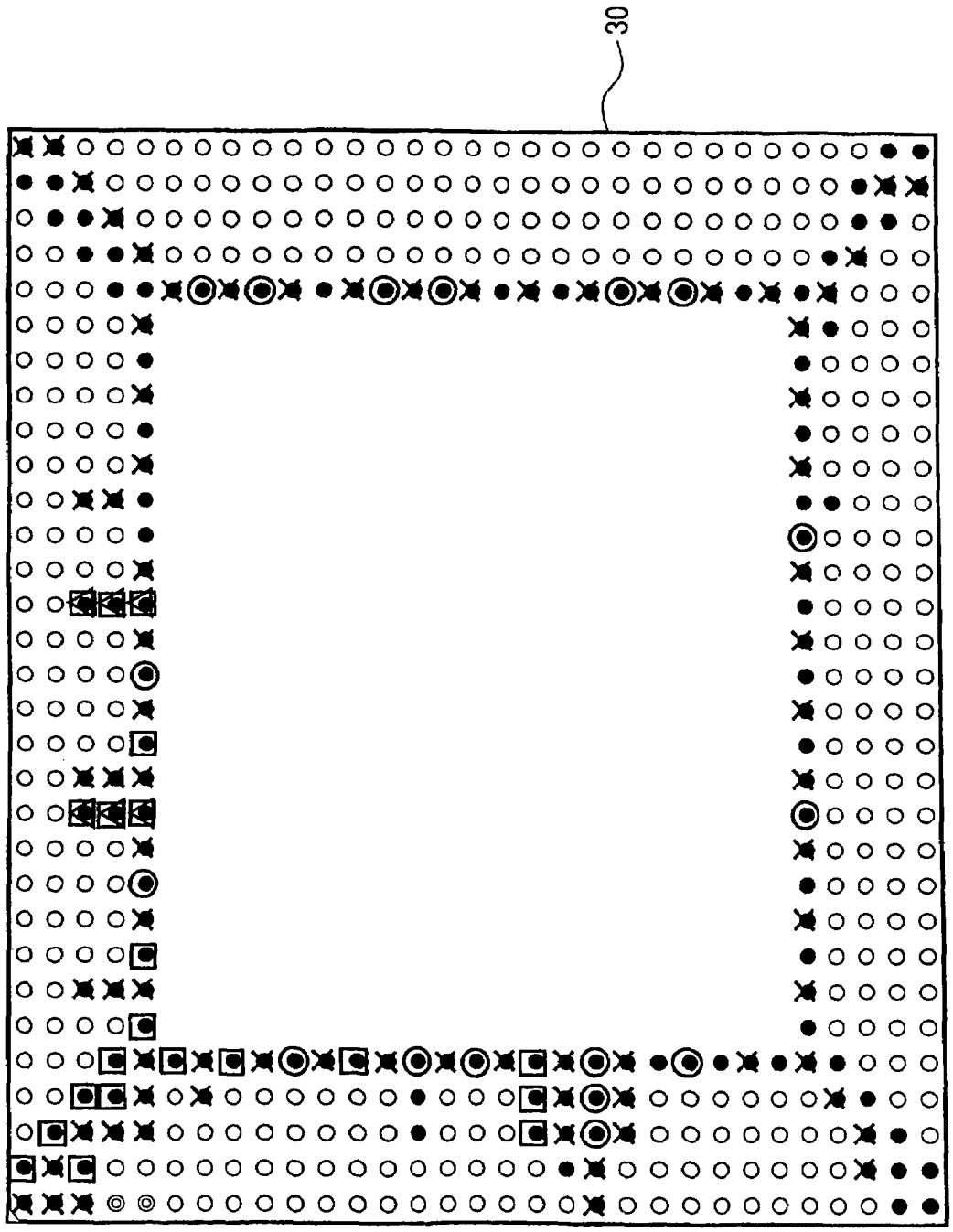
FIG. 6 is a plan view showing an arrangement of solder ball electrodes which are exposed on a surface of the package substrate from a fourth conductive layer Lp4.

FIG. 6 shows the arrangement of the solder ball electrodes which are exposed on a surface of the package substrate 30 from the fourth conductive layer Lp4. Symbols "white dot (circle)" and "duplicate white dot (duplicate circle)" indicate solder ball electrode for signals. Particularly, the symbol "duplicate white dot" indicates differential clock output terminals for SDRAM 4. Symbol which is formed by overlapping black dot (black circle) to symbol x indicates the solder ball electrodes for ground potential. Symbol which is formed by overlapping black dot (black circle) to a squire symbol (squire) indicates the solder ball electrodes for the interface circuit power source with the SDRAM 4 having a voltage of approximately 2.5V, symbol which is obtained by overlapping black dot (black circle) to white dot (white circle) indicates the solder ball electrodes for a digital core power source having a voltage of approximately 1.2V, and simple black dot (black circle) indicates the solder ball electrodes for an external interface power source having a voltage of approximately 3.3V. As can be clearly understood from FIG. 6, the solder ball electrodes are arranged annularly on the package substrate 30 in five rows, wherein a function of supplying the power source potential and the ground potential is allocated to the solder ball electrodes which are arranged at corner portions and the innermost periphery of the chip, while a function of inputting and outputting signals is allocated to the solder ball electrodes arranged on portions along sides which are arranged in a row.

<<A Block Diagram of Electronic Circuit>>

Figure 7:
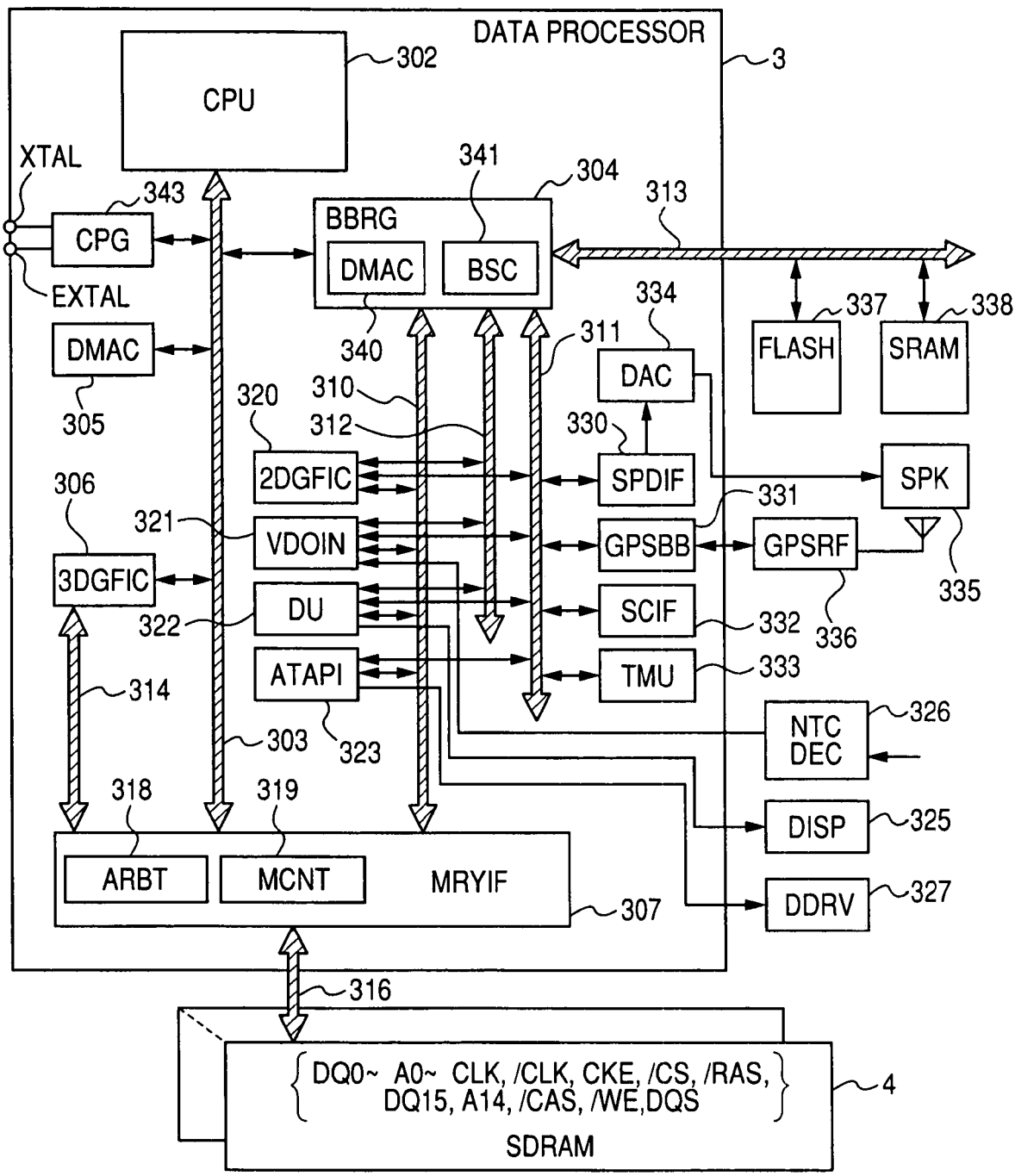
FIG. 7 is a block diagram which illustrates a car navigation system as one example of the electronic circuit.

FIG. 7 shows a block diagram of a car navigation system as one example of the electronic circuit. The data processor 3 is considered as a 1-chip microcomputer formed of a system-on-chip which performs data processing necessary for the car navigation such as a drawing control, a display control, a voice guide control, video data inputting and the like of map data.

The data processor 3 incorporates a CPU (Central Processing Unit) 302 therein. To a first bus 303 to which the CPU 302 is connected, a bus bridge circuit (BBRG) 304, a direct memory access controller (DMAC) 305, a 3D graphic module (3DGFI) 306 which constitutes a three-dimensional image processing part which performs 3-dimensional image processing such as drawing processing of the 3-dimensional image, a clock pulse generator (CPG) 343 and a memory interface circuit (MRYIF) 307 are connected. To the bus bridge circuit 304, a second bus 310, a third bus 311, a fourth bus 312 and an external bus 313 are connected further. To the memory controller 305, a 3D dedicated bus 314 is further connected.

Figure 41:
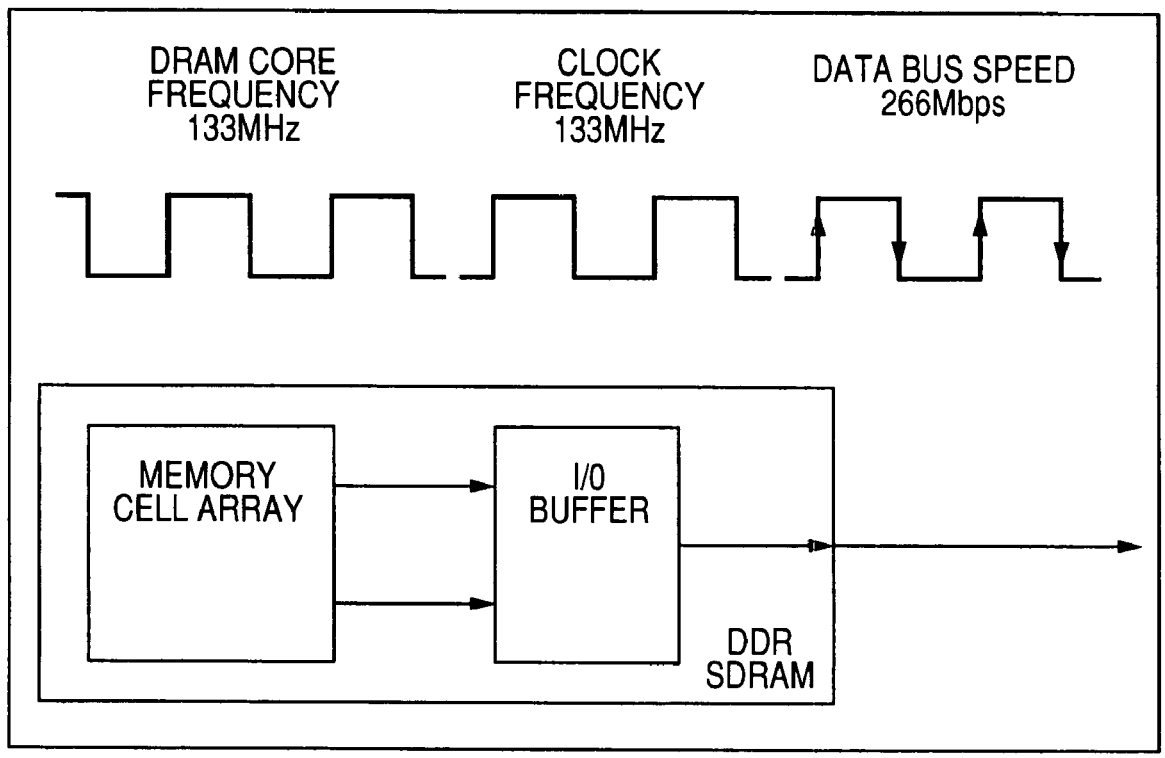
FIG. 41 is an explanatory view which illustrates a first clock interface specification of a DDR-SDRAM.
Figure 42:
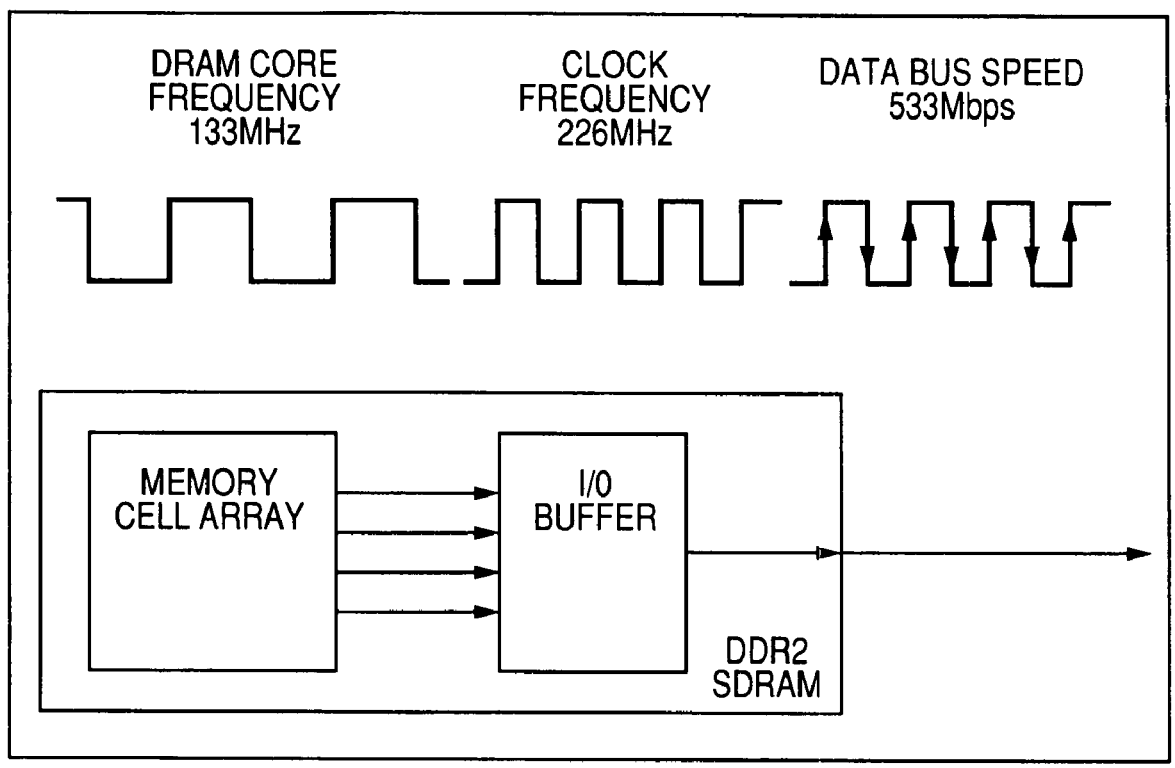
FIG. 42 is an explanatory view which illustrates a second clock interface specification of a DDR-SDRAM.

The above-mentioned SDRAM 4 which constitutes an external memory is connected to the memory interface circuit 307 via the memory bus 316. The SDRAM 4 is, for example, used as a main memory which the CPU 302 uses and as an image memory such as a frame buffer. The memory interface circuit 307 performs a bus arbitration and a memory control. The bus arbitration is a control to arbitrate the competition among external memory accesses via the busses 303, 310, 314 and is performed by a bus arbiter (ARBT) 318. The memory control is a control which operates the SDRAM 4 based on the DDR-SDRAM specification as described in FIG. 41 in accordance with access demands via the busses. That is, in the memory control, in synchronism with rising and falling of the clock signals, timing signals such as strobe signals which allow the SDRAM 4 to perform the reading or writing operation are formed thus operating the SDRAM 4. The memory control is performed by a memory control logic (MCNT) 319.

The 3D graphics module 306 which is connected to the above-mentioned 3D dedicated bus 314 receives an image processing command such as a 3D drawing command from the CPU 302 via the first bus 303 and performs the 3D drawing processing. The drawing is performed on the frame buffer region of the SDRAM 4.

To the second bus 310, a 2D graphics module (2DGFIC) 320 which constitutes a two-dimensional image processing part and also constitutes a first circuit module, a video signal inputting circuit (VDOIN) 321, a display control circuit (DU) 322, an AT attachment packet interface circuit (ATAPI) 323 and the like are connected. The above-mentioned 2D graphics module 320 is a circuit which performs two-dimensional image processing such as drawing processing of a two-dimensional image and also includes a bold-line drawing function, for example. The drawing is performed on the frame buffer region of the SDRAM 4. The display control part 322 performs a control such that the display control part 322 sequentially reads the image data drawn in the frame buffer region of the SDRAM 4, and outputs the image data on a raster-scanning-type display 325 in synchronism with display timing. The video signal inputting circuit 321 receives inputting of digital video signals. The digital video signals are outputted from a NTSC (National Television System Committee) decoder (NTCDEC) 326 which outputs analog video signals such as television signals after coding. The ATAPI 323 is connected to a disc drive device (DDRV) 327 such as a hard disc drive, a DVD or CD-ROM drive, and performs an interface control for reading and acquiring recorded information from a recording medium such as a DVD or a CD-ROM. In the navigation system, map data or the like is recorded in the DVD or the CD-ROM.

To the fourth bus 312, the 2D graphics module 320, the video signal inputting circuit 321 and the display control circuit 322 are connected.

To the third bus 311, a voice data inputting/outputting interface (SPDIF) 330 to which SPDIF is applied with modification and which constitutes a second circuit module, a digital analog converter (DAC) 334, a base band processing part for GPS (Global Positioning System) (GPSBB) 331, a start-stop synchronous serial communication interface circuit (SCIF) 332, a timer (TMU) 333 and the like are connected. A DAC 334 for voices is connected to the SPDIF 331, wherein converted analog vocal signals are converted into voices by a speaker 335. A high frequency part for GSP (GPSRF) 336 is connected to the GPSBB 331, wherein the GPSBB 331 performs arithmetic operation for catching an artificial satellite by allowing the artificial satellite to reflect electric waves via an antenna module.

To the external bus 313, an electrically rewritable flash memory (FLASH) 337 which stores programs and control data for navigation, a static random access memory (SRAM) 338 which is used as a work memory of the CPU 302 and the like are connected. Here, in constituting a multi CPU system, although not shown in the drawing, still another processor may be connected to the external bus 313.

The CPU 302 is, for example, a 32-bit CPU and may have a data processing unit of 32 bits. By providing the superscalar structure which issues a plurality of commands to the CPU 302 in one cycle, the CPU possesses a command processing executing ability which is approximately twice as large as the operational frequency. That is, CPU 302 possesses the so-called two-way superscalar structure. Corresponding to such a structure, as the first bus 303, a 64-bit bus may be adopted. Accordingly, the CPU 302 may execute two commands in parallel so as to prepare two sets of data each being 32 bits, and can transmit two sets of data of 64 bits in total by 1 bus cycle to the first bus 303. Further, the CPU 302 may also lead data of 64 bits from the first bus 303 in 1 bus cycle and may perform the arithmetic processing of data of lower 32 bits and the data of upper 32 bits in parallel separately.

The SDRAM 4 is, although not limited particularly, formed of one semiconductor substrate made of mono-crystalline silicon by a known MOS semiconductor integrated circuit manufacturing technique. The SDRAM 4 includes dynamic-type memory cells which are arranged in a matrix array, wherein a selective terminal of the memory cell is joined to a word line, a data input/output terminals of the memory cell are joined to a bit line, the bit line is formed of a complementary bit line having the fold-back bit line structure about a sense amplifier. The word line is selected in response to a low address signal and the bit line is selected by a column address signal. The sense amplifier detects the fine potential difference which appears on each complementary bit line by reading data from the memory cell, and amplifies the fine potential difference. The complementary bit line becomes conductive to a common data line via a column selecting circuit which is subjected to a switching control in response to a decoding signal of the column address signal. A read amplifier and a writing amplifier are joined to the common data line, wherein, in a reading operation, an output of the sense amplifier is amplified by a read amplifier and is outputted to the outside from a data outputting circuit. In a writing operation, a writing amplifier writes data into the memory cells by driving the complementary bit line in accordance with written data which is inputted from a data inputting circuit. Although not particularly limited, an input terminal of the data inputting circuit and an output terminal of the data outputting circuit are joined to data inputting and outputting terminals DQ0 to DQ15 of 16 bits.

The SDRAM 4 includes, although not limited particularly, address input terminals A0-A14 of 15 bits and low address signals and column address signals are supplied to the SDRAM 4 in an address multiplex state. The SDRAM 4 includes a control circuit, wherein to the control circuit, although not particularly limited, external control signals such as a clock signal CLK, a /CLK (symbol "/" meaning that a signal to which "/" is attached is a low enable signal or a level inverting signal), a clock enable signal CKE, a chip select signal /CS, a column address strobe signal /CAS, a low address strobe signal /RAS, a write enable signal /WE and a data strobe signal DQS are inputted. The manner of operation of the SDRAM 4 is determined based on commands which are defined by the combination of states of respective input signals. The control circuit includes control logic for forming internal timing signals corresponding to operations instructed by these commands.

A clock signal CLK, a /CLK are considered as master clocks of the SDRAM and other external input signals are considered significant in synchronism with a rising edge of the clock signal CLK. The data strobe signal DQS is supplied from the outside as a write strobe signal at the time of performing the writing operation. That is, when the writing operation is instructed in synchronism with the clock signal CLK, the supply of data which is in synchronism with the data strobe signal DQS from a clock signal cycle after the above-mentioned clock signal cycle in which the instruction is made is defined. In the reading operation, the above-mentioned data strobe signal DQS is outputted to the outside as a read strobe signal. That is, in the data reading operation, the data strobe signal is changed in synchronism with an external output of the read data. Accordingly, the DLL (Delayed Lock Loop) circuit and the DQS output buffer are provided. The DLL circuit is provided for adjusting a phase of the clock signal for controlling the data output operation (the control clock signal having the same phase as the data strobe signal DQS' in the reading operation) for synchronizing the output timings of the clock signal CLK which the SDRAM 4 receives and the data from the data outputting circuit. The DLL circuit, although not particularly limited, regenerates an internal clock signal which is capable of compensating for the signal propagation delay time characteristic of the internal circuit using a replica circuit technique and a phase synchronizing technique. Then, the data output circuit which performs an outputting operation based on the internal clock signal can output the data at timing which is surely synchronized with the external clock signal CLK. The DQS output buffer outputs the data strobe signal DQS with the phase equal to the phase of the internal clock signal to the outside.

The low address signal is defined by levels of the address input terminals A0 to A12 in a low-address-strobe bank-active-command (active command) cycle described later which is in synchronism with a rising edge of the clock signal CLK. The column address signal is defined by levels of the address input terminals A0 to A11 in a column address read command (read command) cycle and a column address write command (write command) cycle described later which are synchronized with a rising edge of the clock signal CLK. The low-address-strobe bank-active-command is a command which makes the instruction of the low address strobe effective, wherein the low-address-strobe bank-active-command is instructed by /CS, /RAS=low level ("0"), /CAS, /WE=high level ("1"). Here, the address which is supplied to the A0 to A12 is acquired as the low address signal and the signal which is supplied to A13, A14 is acquired as a selection signal of a memory bank. The column address read command is a command which is necessary for starting a burst-read operation and also is a command which gives an instruction of the column address strobe, wherein the column address read command is instructed by /CS, /CAS=low level, /RAS, /WE=high level. Here, the address which is supplied to the A0 to A11 is acquired as a column address signal. Besides these commands, a column address write command, a precharge command, a self refresh entry command and the like can be used. The SDRAM 4 enables the data inputting/outputting in synchronism with both edges of rising and falling of the data strobe signal DQS which is synchronized with the clock signal CLK and can perform the inputting/outputting of the addresses and control signals in synchronism with the clock signal CLK and hence, the SDRAM 4 can operate the large capacity memory thereof substantially equal to the memory of the DRAM at a high speed compatible to a speed of a SRAM. Further, by designating the number of data which the selected one word line can get access to based on a burst length, a column-system selection state is sequentially changed over by an incorporated column address counter thus realizing the continuous reading or writing of a plurality of data.

<<Reduction of Skew Between Bits of Parallel Data>>

Figure 8:
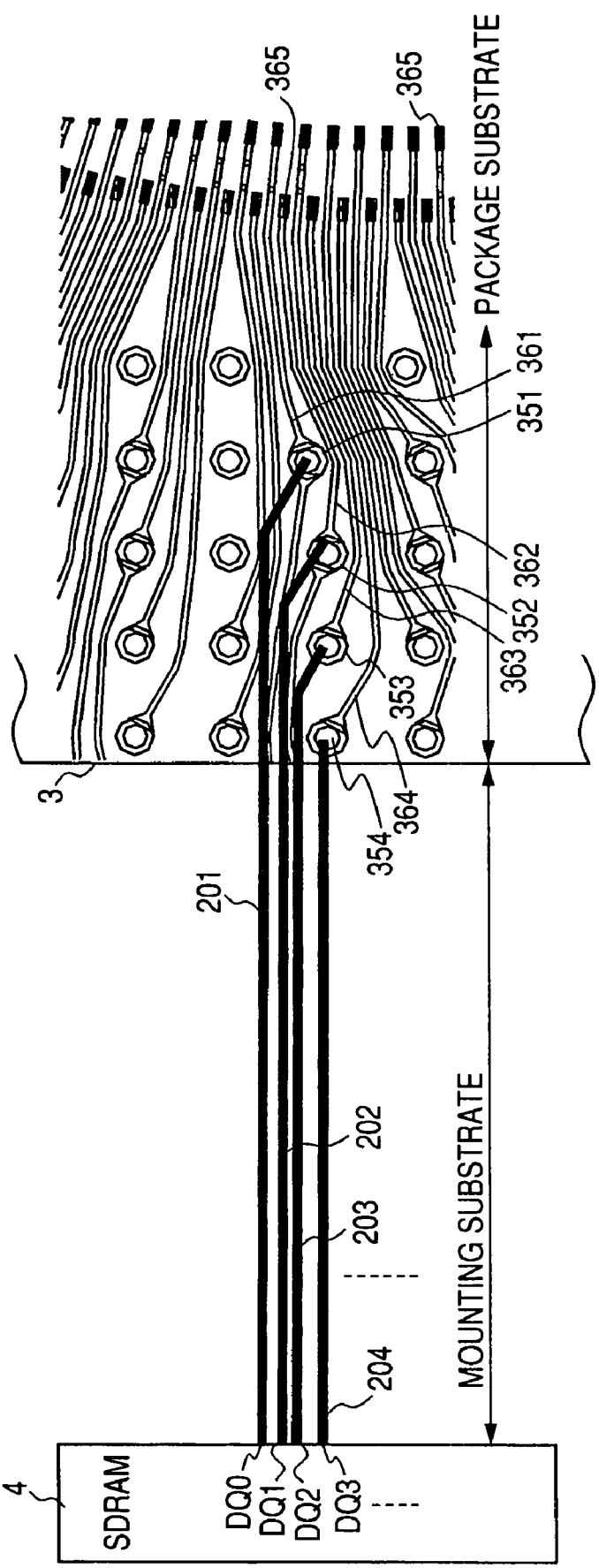
FIG. 8 is an explanatory view which illustrates the equal-length wiring structure for reducing a skew between bits of parallel data.

FIG. 8 illustrates the equal-length wiring structure for reducing a skew between bits of parallel data such as terminals DQ0 to DQ15 of the SDRAM. Among the solder ball electrodes which are annularly arranged in five rows as described above, a signal inputting/outputting function is allocated to the solder ball electrodes formed on a portion of a side of the package substrate, wherein, for example, numerals 351 to 354 indicate through holes in the vicinity of the solder ball electrodes for inputting/outputting data (not shown in the drawing) which are connected corresponding to terminals DQ0 to DQ3 of the SDRAM. Lengths of the mounting substrate lines from the terminals DQ0 to DQ3 of the SDRAM 4 to the solder ball electrodes 351 to 354 of the data processor 3 are set unequal from each other for respective bits and hence, assembling lines (package lines) which reach the bonding pads of the processor chip 31 from the solder ball electrodes 351 to 354 of the data processor 3 are set unequal to each other for respective bits. Here, the unequal lengths of the mounting substrate lines 201 to 204 and the unequal lengths of the assembling lines 361 to 364 have the offsetting relationship. To offset the unequal lengths implies that, when the lengths of assembling lines are unequal from each other, the sums of lengths of the assembling lines and the mounting substrate lines which respectively correspond to the assembling lines become closer to each other. That is, to express this in other words, assuming the sums of lengths of the assembling lines and the corresponding mounting substrate lines as lengths of the whole lines for respective bits of the data bus, the difference of the whole lines for respective bits is set smaller than the difference of the line lengths for respective bits.

In FIG. 8, the bonding wires which constitute portions of the assembling lines are not shown in the drawing. With respect to the bonding wires, the bonding wires connect the bonding pads 365 and the bonding pads of the processor chip 31 on the assembling board 30. With respect to the unequal lengths of the lines, to be specific, the unequal lengths of the assembling lines 361 to 364 in the inside of the package board are integer times as large as a pitch in the row direction of the solder ball electrodes 351 to 354. Corresponding to such an arrangement, mounting substrate lines 201 to 204 on the mounting substrate 2 may be set to the unequal lengths with the differences which are integer times as large as the pitch in the row direction. Although the significance of the unequal lengths is not limited to the above, the significance of the unequal lengths is collectively grasped as a common concept that the unequal lengths are integer times as large as the pitch in the row direction of the solder ball electrodes in both of the data processor 3 and the mounting substrate 2. The unequal wiring structure may be constituted in the same manner with respect to other data inputting/outputting terminals.

Figure 9:
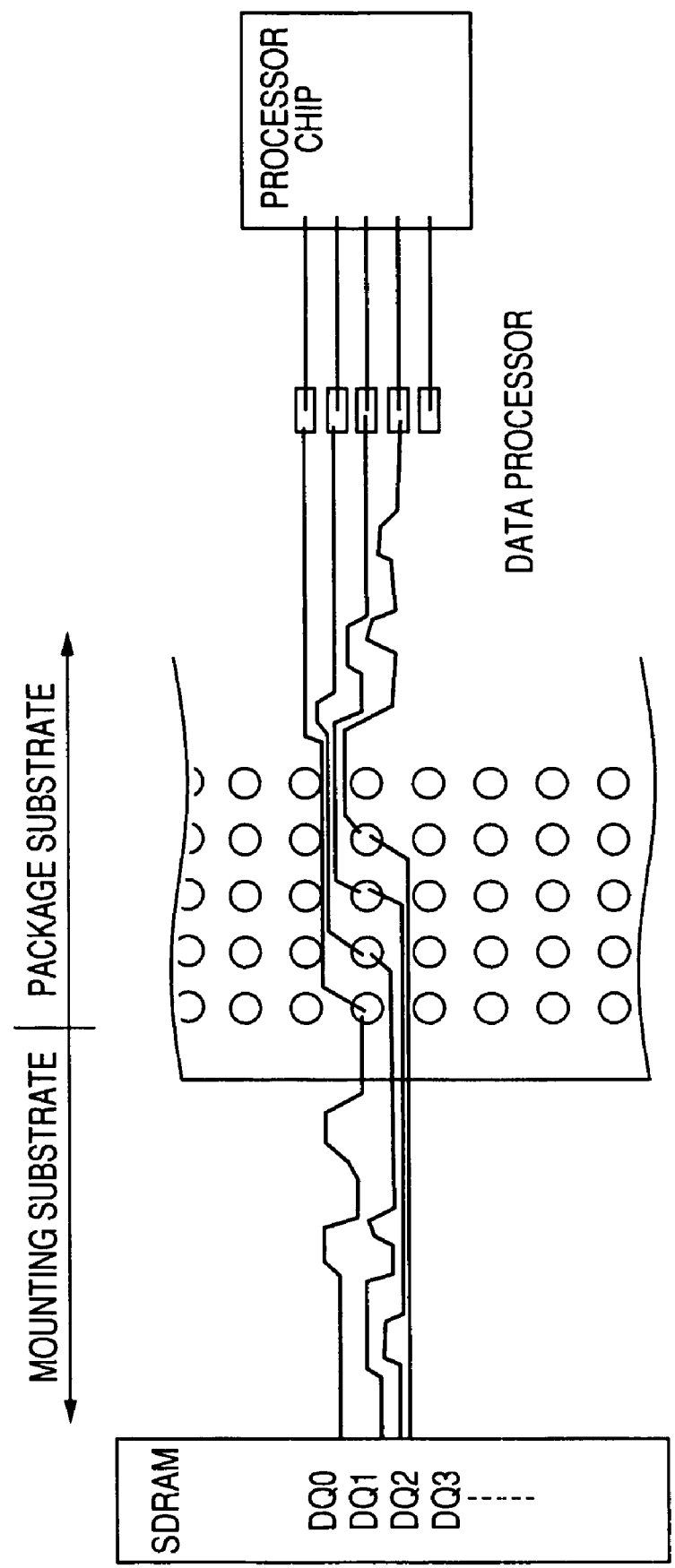
FIG. 9 is an explanatory view showing a comparison example of FIG. 8.

Due to such a constitution, it is unnecessary to set the lengths between the external terminals such as solder ball electrodes 351 to 354 of the data processor 3 and the corresponding bonding pads of the processor chip 31 equal to each other. In designing and manufacturing the mounting substrate 2 which mounts the data processor 3 thereon, in accordance with the content of the unequal lengths of the data processor 3, the lines which connect the data processor 3 and the SDRAM 4 may be set unequal to each other on the mounting substrate 2 such that the unequal lengths of the data processor 3 are offset. The degree of unequal lengths of the lines on the mounting board 3 may be determined easily based on a wiring length correction method which is preliminarily prepared. For example, the degree of unequal lengths may be defined such that the length of the line which is connected to the solder ball electrode arranged on the innermost periphery is set longer than the length of the line which is connected to the solder ball electrode arranged on the second periphery counted from the innermost periphery by αmm, is set longer than the length of the line which is connected to the solder ball electrode arranged on the third periphery counted from the innermost periphery by 2 αmm, and is set longer than the length of the line which is connected to the solder ball electrode arranged on the fourth periphery counted from the innermost periphery by 3 αmm. The above-mentioned α may be the arrangement pitch of the solder ball electrode, for example. Accordingly, it is unnecessary to perform an aligning operation exemplified in a comparison example shown in FIG. 9 in which the respective lines have middle portions thereof bent to make the lines equal in the inside of the data processor as well as on the mounting substrate. It is possible to reduce the skew between bits of the parallel access data avoiding the increase of the wiring area and cumbersomeness attributed to bending. Accordingly, even when an operational speed of the system becomes a high speed, the data processor can acquire without an error the parallel data of several tens bits which is outputted from a plurality of SDRAMs 4 in synchronism with the change of the data strobe signal DQS.

Here, in the SDRAM 4, the lengths of assembling lines which reach the connection electrodes of the semiconductor chip from the external terminals are set equal to each other. However, when another package structure is adopted and the lengths of assembling lines which reach the connection electrodes of the semiconductor chip from the external terminals are set unequal from each other, the unequal lengths of the mounting substrate lines may be determined by also taking such unequal lengths into consideration.

<<Terminating Processing of One-Way Line Having Branch>>

Figure 10:
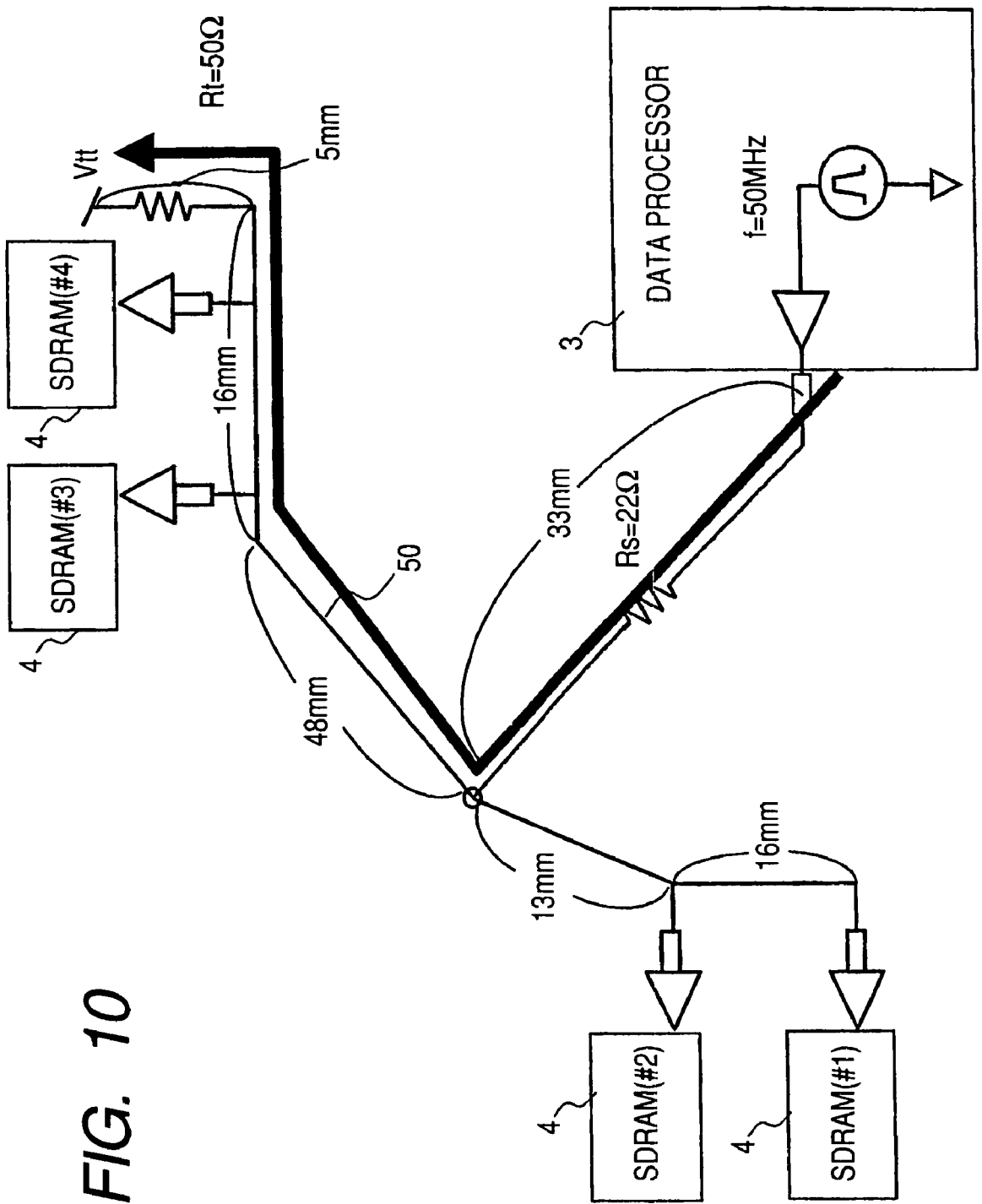
FIG. 10 is an explanatory view showing one example of terminating processing of one-way lines which are connected to command terminals or address terminals of plural SDRAMs.

FIG. 10 shows one example of terminating processing of one-way lines which are connected to command terminals or address terminals of plural SDRAMs 4. The signal line on the mounting substrate 2 is connected with a terminating power source (Vtt) with a terminating resistance in accordance with the characteristic impedance thus suppressing noises attributed to the undesired voltage reflection. For example, the data terminals DQ0 to DQ15 of the each SDRAM 4 are respectively connected with corresponding data terminals of the data processor 3 via the respective intrinsic signal lines for every bit. Accordingly, the terminating processing applied to such a signal line may be performed by branching the line in the vicinity of the SDRAM 4 and by joining the signal line to the Vtt via the terminating resistance. Although the connection of the data terminals may adopt the intrinsic connection for respective bits also in the application mode in which the SDRAMs 4 are accessed in parallel, the command input terminals such as the /RAS, the /CAS and the like and the address input terminals such as A0 to A14 of the SDRAM 4 are connected with the plurality of SDRAMs 4 in common. For example, when four SDRAM (#1) 4 to SDRAM (#4) 4 are arranged in a dispersed manner, the address terminals A0 are connected with the corresponding address output terminal of the data processor in common. There is enough possibility that such a line 50 on the mounting substrate becomes the one-way line having a branch. In applying the terminating processing to the line 50, to assign the best priority to the suppression of the voltage reflection by the signal termination, it is preferable that the terminating resistance Rt of the one-way line 50 having a branch is joined to a route having a longer route length which starts from the data processor 3. Since the shorter route is considered as the concentrated constant capacity, it is preferable to make the shorter route as short as possible.

Figure 11:
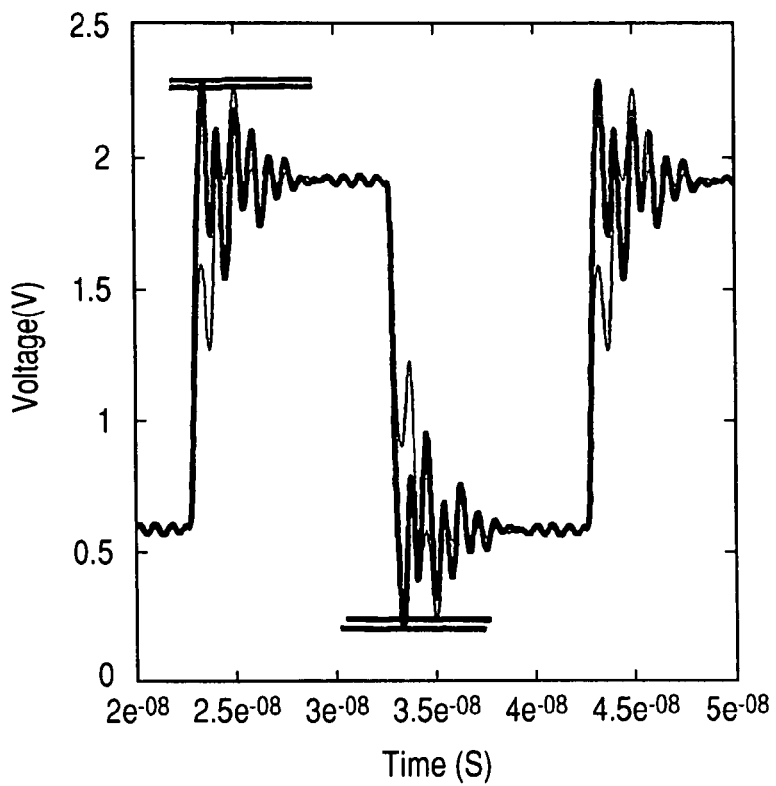
FIG. 11 is a simulation result of a signal waveform which is observed at an input terminal of a DRAM (#1) in FIG. 10.

FIG. 11 shows a simulation result of a signal waveform which is observed at an input terminal of a DRAM (#4) in FIG. 10. A bold-line waveform shows a case in which the longer route on the SDRAM (#4) side is terminated, while a fine-line waveform shows a case in which the shorter route on the SDRAM (#1) side is terminated. It is understood that the case indicated by the bold waveform which terminates the longer route exhibits the large reduction of noises such as an overshoot. Further, the case indicated by the bold waveform which terminates the longer route requires a shorter time until the voltage becomes stable at a High level and hence, possesses a large timing margin.

Figure 12:
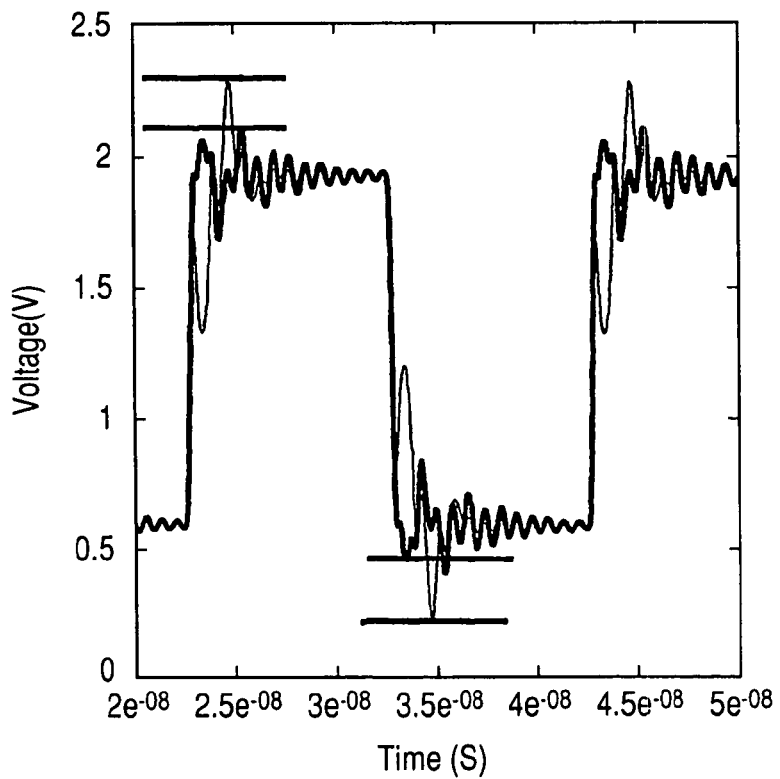
FIG. 12 is a simulation result of a signal waveform which is observed at an input terminal of a DRAM (#4) in FIG. 10.

FIG. 12 shows a simulation result of a signal waveform which is observed at an input terminal of a DRAM (#1) in FIG. 10. A bold-line waveform shows a case in which the longer route on the SDRAM (#4) side is terminated, while a fine-line waveform shows a case in which the shorter route on the SDRAM (#1) side is terminated. It is understood that even when the longer route is terminated, noises such as an overshoot are hardly changed. Further, the case indicated by the bold waveform which terminates the longer route requires a shorter time until the voltage becomes stable at a High level and hence, possesses a large timing margin.

Figure 13:
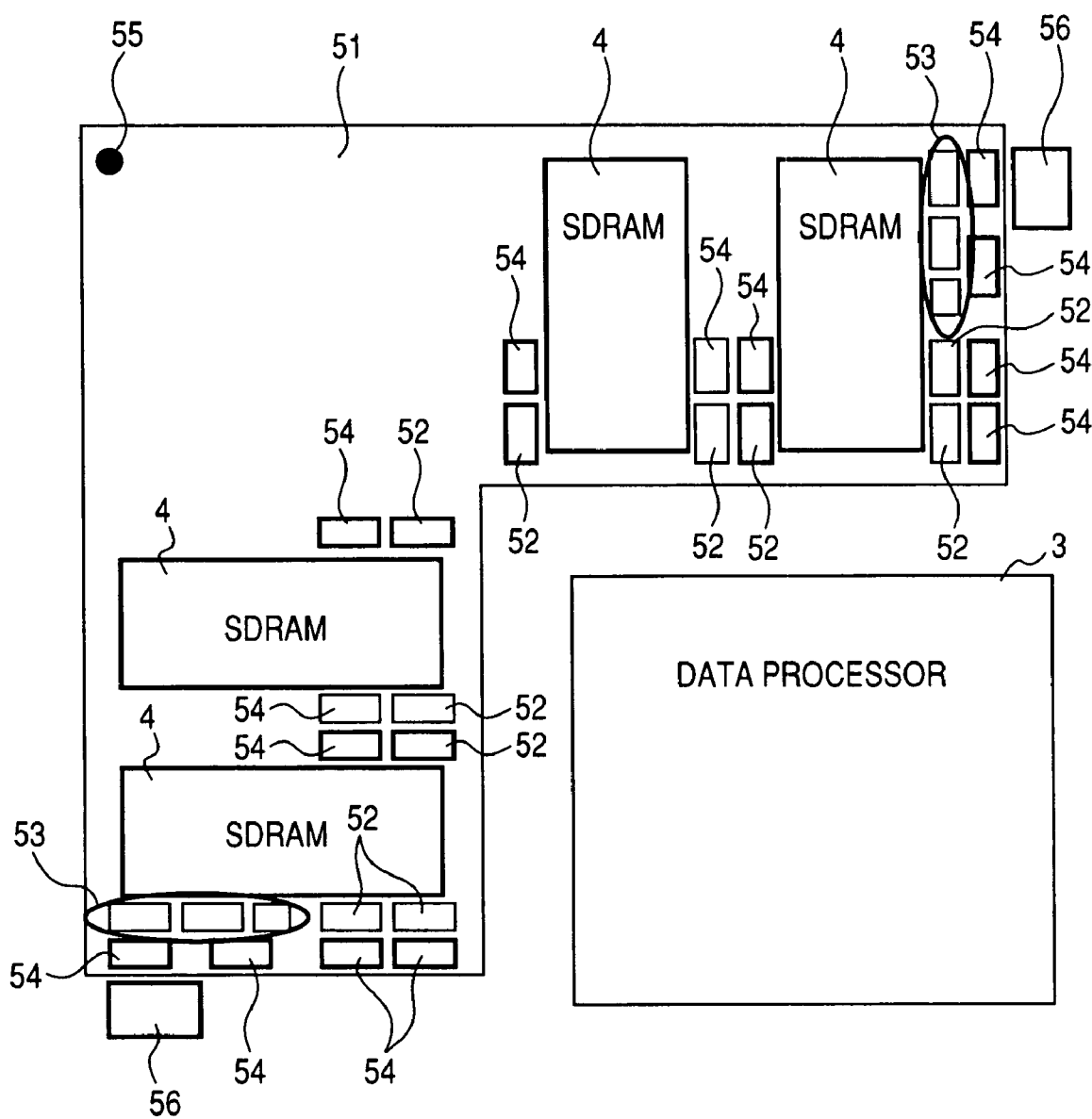
FIG. 13 is a plan view which illustrates an arrangement example of the SDRAM, terminating resistances and the like for a terminating power source plane.

FIG. 13 illustrates an arrangement example of the SDRAM, terminating resistance and the like for a terminating power source plane 51. The total bit number of the data inputting/outputting terminals and the command and address terminals of the SDRAM 4 is relatively large and, further, states of these terminals are changed in parallel. Accordingly, it is a requisite that the terminating power source Vtt which is connected to the terminating resistance (symbol Rt being attached to refer the terminating resistance collectively) possesses a relatively large current supply ability and is stable. From this viewpoint, the SDRAMs 4 are arranged in dispersed manner with respect to the terminating power source plane 51 of the Lm5 and, to the terminating power source plane 51, a plurality of terminating resistances 52 which are connected to the data lines, a plurality of terminating resistances 53 which are connected to command and address lines, and a plurality of first stabilizing capacities 54 which are arranged in the vicinity of the terminating resistance are joined in a dispersed manner. The terminating resistances 52 are provided for terminating the lines which are connected to the data terminals DQ0 to DQ15 and are arranged in the immediate vicinity of the corresponding SDRAMs 4. The terminating resistances 53 are provided for terminating the one-way lines having a branch which are connected to the command and address terminals and are arranged at ends of the terminating power source plane. The first stabilizing capacities 54 are constituted of a capacitive element having a small parasitic inductance component to prevent the generation of an undesired inductance component. Further, a second stabilizing capacity 56 which is larger than the first stabilizing capacity 54 is connected to an end portion of the terminating power source plane 51 remote from a supply end 55 to which the terminating power source is supplied. The first stabilizing capacity 54 compensates for a potential change in the vicinity of the terminating resistance Rt. The second stabilizing capacity 56 compensates for a potential change at the remote end of the terminating power source plane 51.

In FIG. 13, the above-mentioned terminating power source plane 51 includes a shape which embraces a rectangular corner portion of the rectangular mounting substrate 2, wherein the supply end 55 of the above-mentioned terminating power source Vtt is arranged in the vicinity of the rectangular corner portion, and the power source plane 51 of the terminating power source Vtt extends to both sides of the supply end 55 of the above-mentioned terminating power source Vtt. As described, to take the reduction of the skew between bits into consideration, it is desirable that the terminals of parallel data such as DQ0 to DQ15 of the SDRAM 4 are arranged at the portion of the side of the data processor 3 and hence, the arrangement of the terminating power source plane 51 which supplies the terminating power source Vtt at the corner portion does not compete such a request in view of place.

Figure 14:
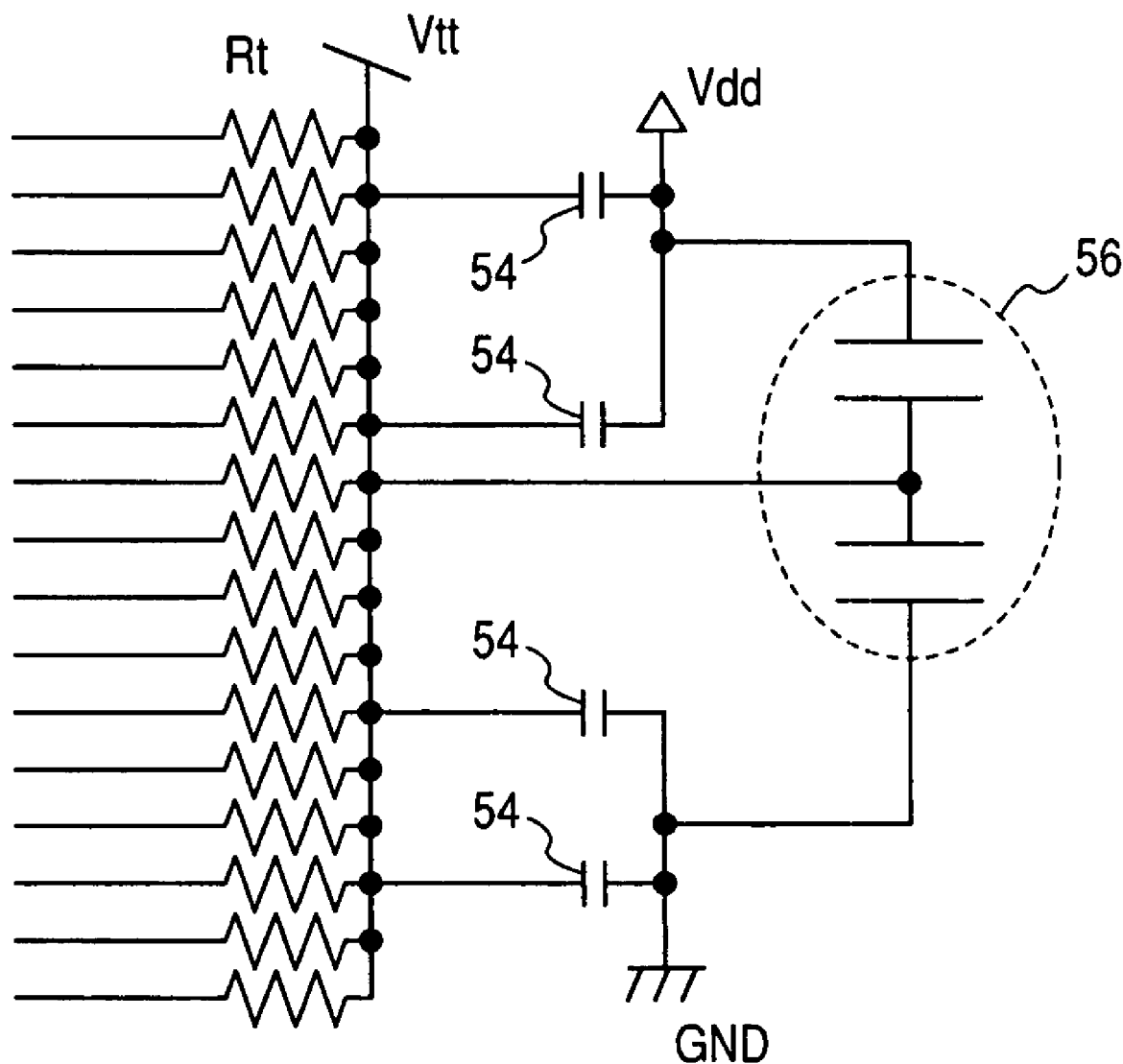
FIG. 14 is a circuit diagram which illustrates an electrical connection state of a first stabilizing capacity and a second stabilizing capacity.

FIG. 14 illustrates an electrical connection state of the first stabilizing capacity 54 and the second stabilizing capacity 56. The first stabilizing capacity 54 is arranged such that one stabilizing capacity 54 is allocated to four terminating resistances, wherein one half of the first stabilizing capacity 54 is connected with the power source voltage Vdd and remaining half may be connected with the ground potential GND. The second stabilizing capacity 56 may be arranged on one side of the terminating power source plane 51 and may be connected between the terminating voltage Vtt and the power source voltage Vdd and between the terminating voltage Vtt and the ground potential GND respectively.

Figure 15:
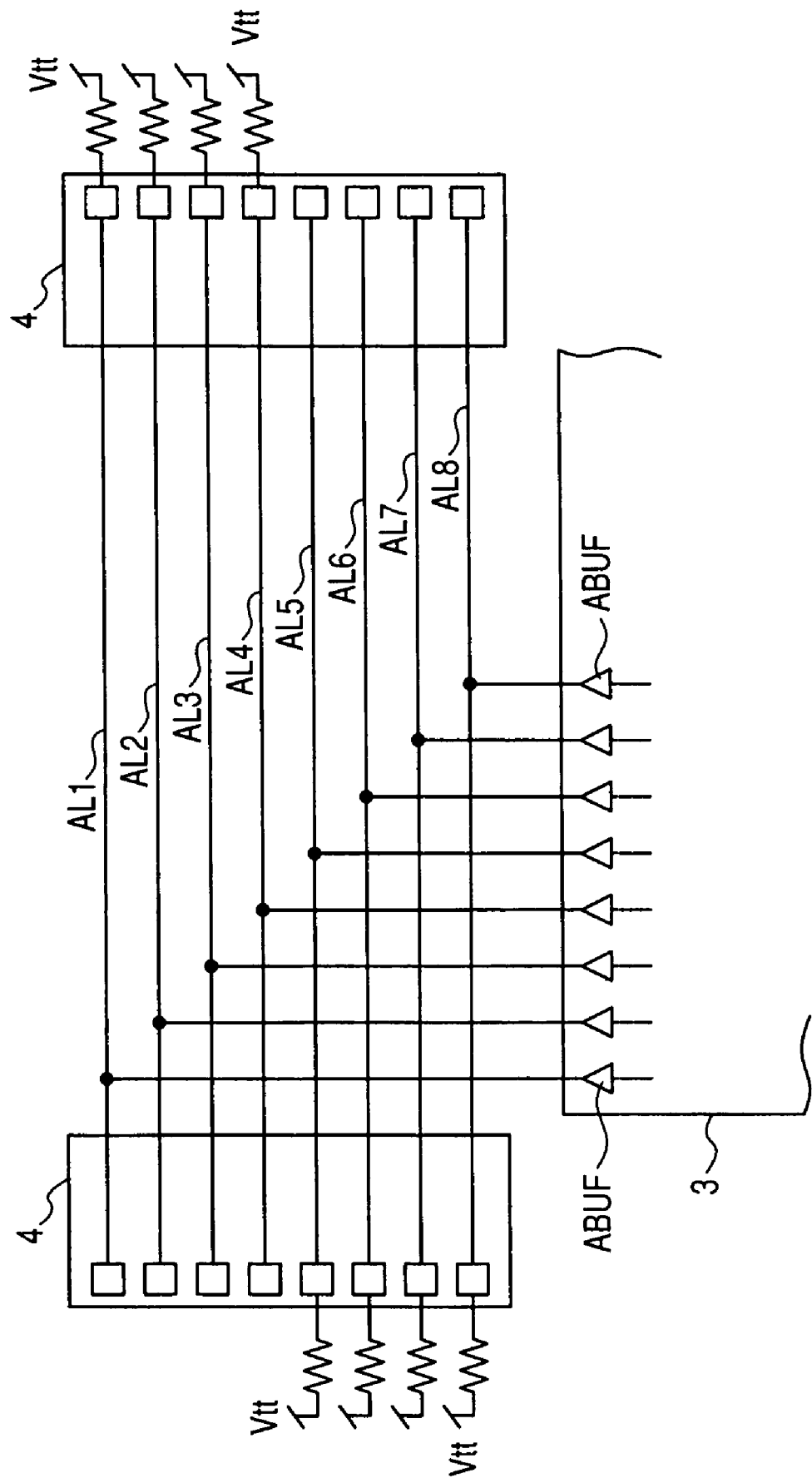
FIG. 15 is a circuit diagram which illustrates a terminating processing result for address lines which connect two SDRAMs 4.

With respect to the above-mentioned terminating processing which is explained in conjunction with FIG. 10, another viewpoint may be taken into consideration. That is, the commands and addresses are formed of a signal of a plurality of bits and hence, it is desirable to arrange the terminating resistances in a dispersed manner with respect to the terminating power source plane so as to make the terminating power source stable. To take this request into consideration, it is not always optimum to join the terminating resistance to the longer route. Accordingly, in the one-way lines having a branch to which a plurality of SDRAMs 4 are connected in common among the above-mentioned lines, the one-way lines which join the terminating resistance to the route having the longer route length starting from the data processor 3 and the one-way lines which join the terminating resistance to the route having the shorter length starting from the data processor 3 exist in mixture. A maximum value of the difference in route length between the longer route and the shorter route in the one-way line which joins the terminating resistance to the shorter route is set to a value equal to or less than a minimum value of the difference in route length of the shorter route and the longer route in the one-way line which connects the terminating resistance to the longer route. For example, to consider the address lines which connect two SDRAMs 4 thereto as shown in FIG. 15, the terminating resistance is joined to the branched route having the longer distance from the address output buffer with respect to the address lines AL1 to AL4, AL7, AL8, while the terminating resistance is joined to the branched route having the shorter distance from the address output buffer ABUF with respect to the address lines AL5, AL6. Here, assuming the maximum value La of the difference in route length between the longer route and the shorter route with respect to the address lines AL5, AL6 which join the terminating resistance to the shorter route as the long/short route difference in the address line AL5 and the minimum value Lb of the difference in route length between the shorter route and the longer route with respect to the address lines AL1 to AL4, AL7, AL8 which join the terminating resistance to the longer route as the long/short route difference Ld in the address line AL7, the maximum value La is set to a value equal to or less than the minimum value Lb. In short, it is guaranteed that noises which are generated in the longer route of the address line AL5 when the shorter route such as AL5 is terminated do not exceed noises which are generated in the shorter route of the AL7 when the longer route such as AL7 is terminated. Accordingly, by taking the dispersed arrangement of the terminating resistances with respect to the terminating power source plane 51 into consideration, it is also possible to suppress the influence attributed to the voltage reflection to a minimum.

Figure 16:
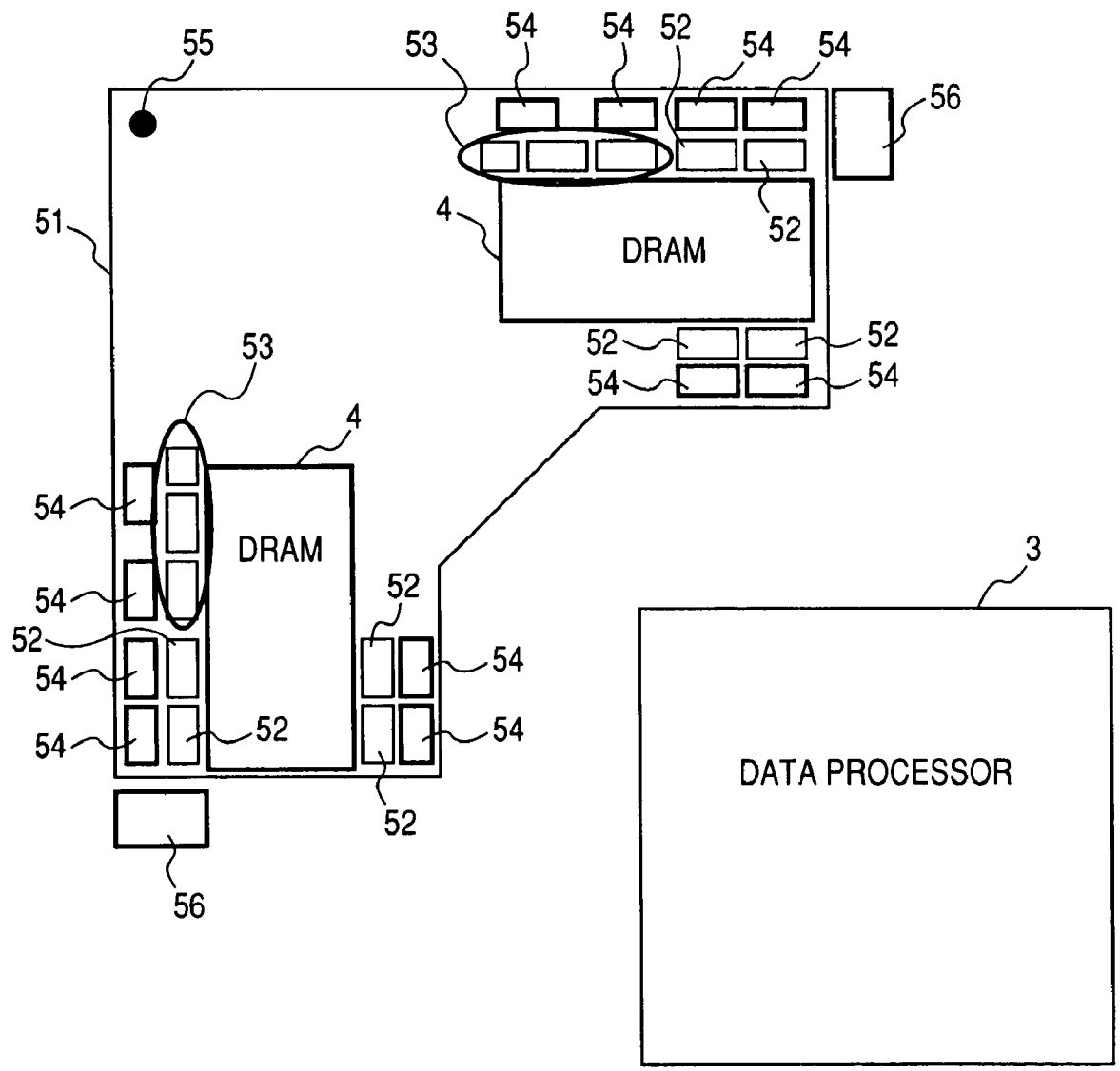
FIG. 16 is a plan view which illustrates an arrangement of the SDRAM, the terminating resistances and the like with respect to a power source plane when two SDRAMs 4 are mounted on front and back surfaces of a mounting substrate respectively.

FIG. 16 illustrates an arrangement example of the SDRAM, the terminating resistances and the like with respect the power source plane 51 when two SDRAMs 4 are mounted on a front and back surfaces of the mounting substrate 2 respectively. In the same manner as the arrangement example shown in FIG. 13, the second stabilizing capacity 56 is arranged at a remote end of the terminating power source plane 51, and the first stabilizing capacity 53 and the terminating resistance 54 are arranged in a dispersed manner in the vicinity of the SDRAM 4.

<<Prevention of Separation of VCC (VSS) Plane on the Mounting Substrate>>

As explained in conjunction with FIG. 1, in the mounting substrate 2 having a multi-layered wiring structure, from a viewpoint of shielding or the like, the ground plane and the power source plane are formed on the conductive layers Lm2, Lm3 arranged between the conductive layers Lm1, Lm4, and a large number of the via holes and the through holes which connect the conductive layers penetrate the ground plane and the power source plane in a non-contact state. Particularly, as shown in FIG. 6 as an example and as represented by the BGA package structure, the data processor 3 which is mounted on the mounting substrate 2 includes external interface-terminals which are formed of solder ball electrodes which are arranged annularly in a plurality of rows. Further, the solder ball electrodes are arranged at a narrow pitch and hence, in the ground plane and the power source plane of the conductive layers Lm2, Lm3, a large number of non-contact penetration holes formed of the via holes and through holes which are connected to the lands to which the solder ball electrodes are joined are annularly formed. The mounting substrate 2 adopts the following constitution for preventing a phenomenon that a current route which is defined between the outer peripheral portion and the inner peripheral portion of annular arrangements which are respectively formed of the large number of penetration holes becomes substantially narrow or a display device cannot obtain necessary current supply ability.

Figure 17:
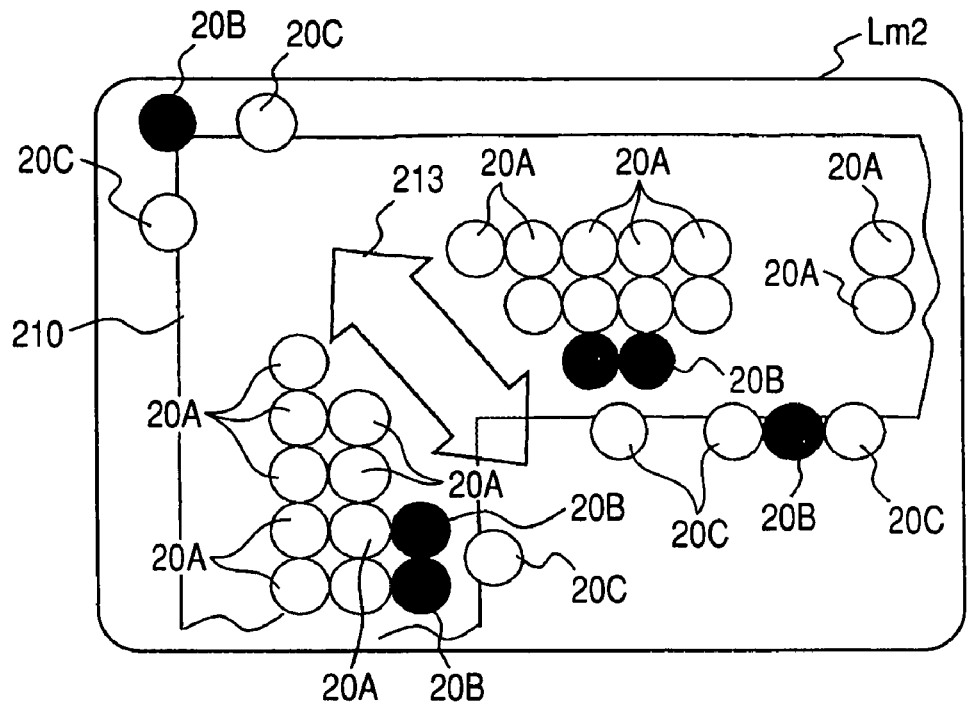
FIG. 17 is an explanatory view which illustrates a state of vias which penetrate a ground plane of a conductive layer Lm2.
Figure 18:
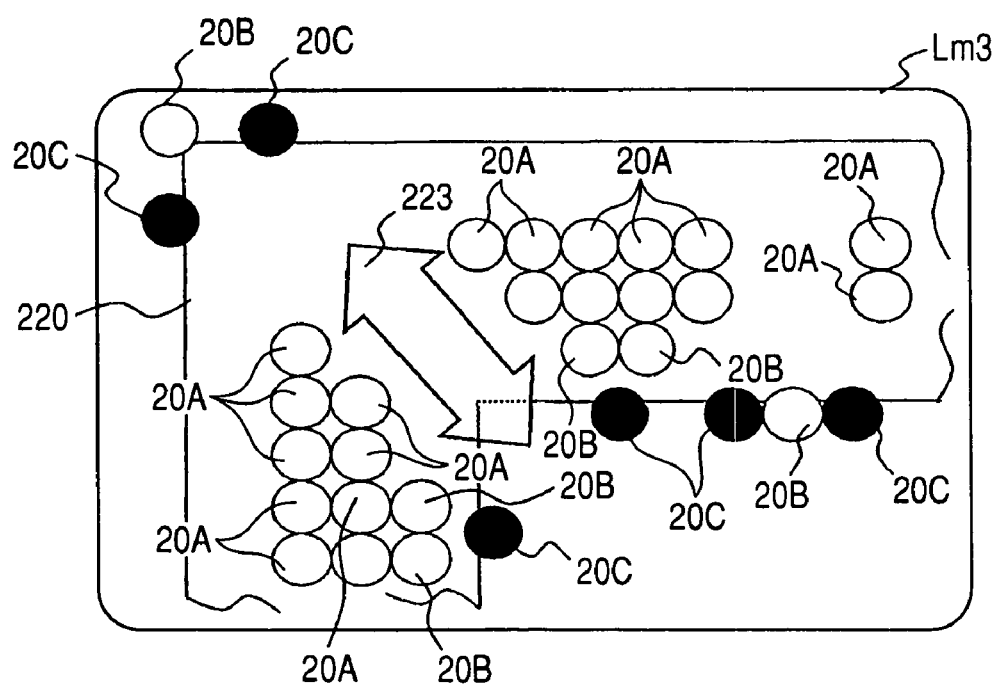
FIG. 18 is an explanatory view which illustrates a state of vias which penetrate a power source plane of a conductive layer Lm3.

FIG. 17 illustrates a state of vias which penetrate the ground plane of the conductive layer Lm2 and FIG. 18 illustrates a state of vias which penetrate the power source plane of the conductive layer Lm3.

In FIG. 17, a region which is indicated by numeral 210 is collectively referred to as a region which the vias penetrate (via penetrating region). Black dots (black circle) indicate vias which penetrate the region in a contact state and white dots (white circle) indicate vias which penetrate the region in a non-contact state. The vias 20A for supplying signals and the vias 20C for supplying a power source penetrate the ground plane in a non-contact state and the vias 20B for supplying a ground potential penetrate the ground plane in a contact state. In the region 210, the ground plane includes a specified region indicated by numeral 213 which the vias do not penetrate and the specified region 213 has a width equal to or larger than one pitch of the solder ball electrodes 34 which constitute external terminals arranged in the data processor 3. Due to such a constitution, a large number of non-contact penetration holes formed of the vias are annually formed in a large number in the ground plane thus suppressing a phenomenon that the current route between the outer peripheral portion and the inner peripheral portion of the annular penetration holes becomes substantially narrow.

In FIG. 18, a region which is indicated by numeral 220 is collectively referred to as a region which the vias penetrate (via penetrating region). Black dots (black circle) indicate vias which penetrate the region in a contact state and white dots (white circle) indicate vias which penetrate the region in a non-contact state. The vias 20A for supplying signals and the vias 20B for supplying a ground potential penetrate the power source plane in a non-contact state and the vias 20C for supplying a power source penetrate the power source plane in a contact state. In the region 220, the power source plane includes a specified region indicated by numeral 223 which the vias do not penetrate and the specified region 223 has a width equal to or larger than one pitch of the solder ball electrodes 34 which constitute external terminals arranged in the data processor 3. Due to such a constitution, a large number of non-contact penetration holes formed of the vias are annually formed in the power source plane thus suppressing a phenomenon that the current route between the outer peripheral portion and the inner peripheral portion of the annular penetration holes becomes substantially narrow. Although not shown in the drawings particularly, the specified regions 213, 223 are formed at four corner portions of the rectangular mounting substrate 2.

According to the above-mentioned constitution, it is possible to prevent the ground plane and the power source plane of the mounting substrate 2 from being separated into the inside and the outside with respect to the current supply ability.

Figure 19:
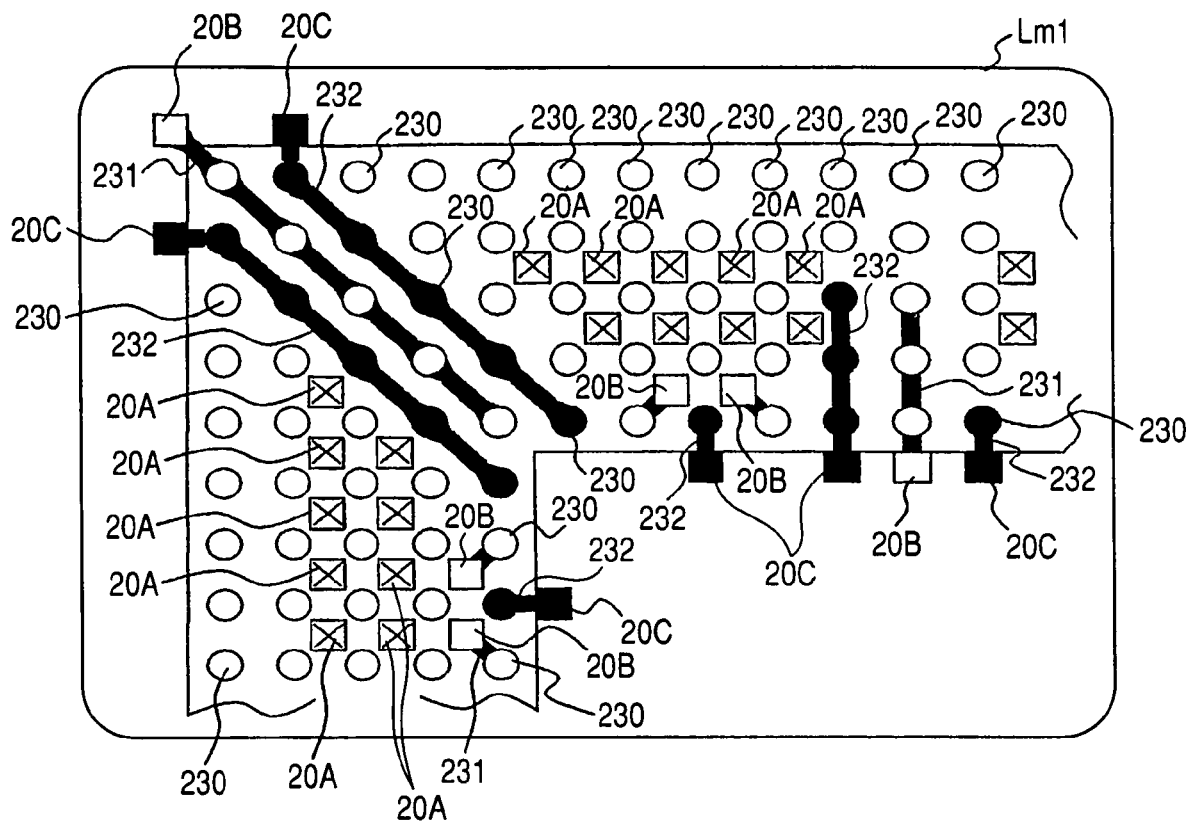
FIG. 19 is an explanatory view which illustrates a state of power source lines and ground lines of a conductive layer Lm1 corresponding to FIG. 17 and FIG. 18.

FIG. 19 illustrates a state of the power source lines and the ground lines of the conductive layer Lm1 corresponding to the conductive layers shown in FIG. 17 and FIG. 18. Combine symbols of "white square" and symbol "x" indicate signal vias 20A, symbol "white square" indicates ground vias 20B, symbol "black square" indicate power source vias 20C, and symbol "white dots (white circle)" indicates lands. Numeral 231 indicates power source lines and numeral 232 indicates ground lines.

The specified regions 213, 223 are arranged in the vicinity of the corner portion of the rectangular data processor 3 which is mounted above the specific regions 213, 223. To take the reduction of the skew between bits into consideration, it is desirable to arrange the terminals of the parallel data at portions of sides of the data processor 3 and hence, the prevention of separation of the power source plane or the ground plane at the corner portions does not compete with such a request in view of place.

Figure 20:
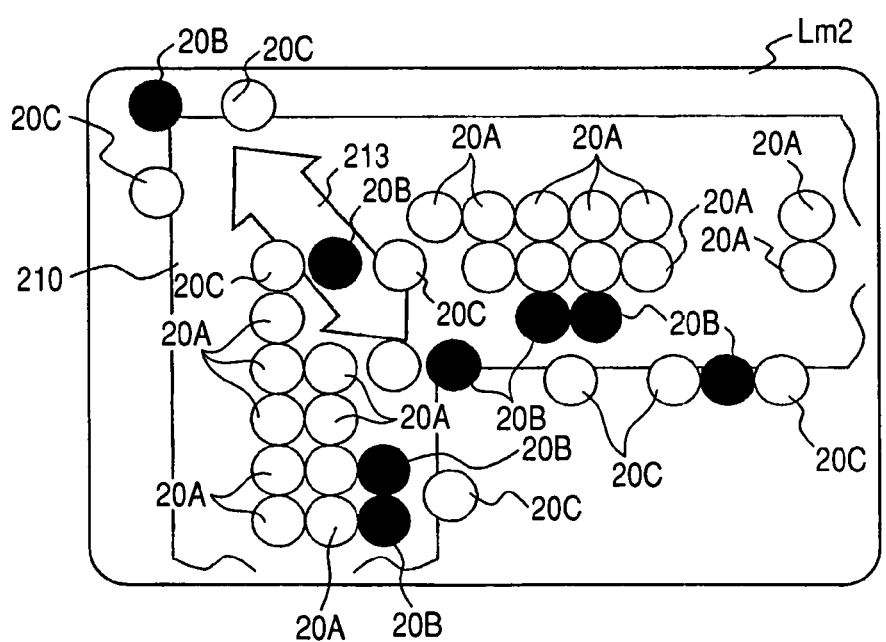
FIG. 20 is an explanatory view showing a modification with respect to a state of vias which penetrates the ground plane of the conductive layer Lm2.
Figure 21:
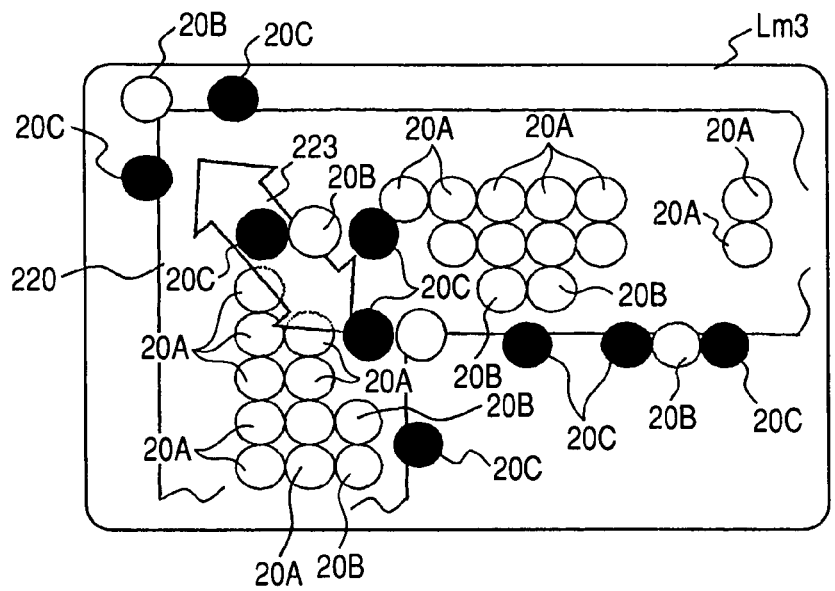
FIG. 21 is an explanatory view showing a modification with respect to a state of vias which penetrates the ground plane of the conductive layer Lm2.
Figure 22:
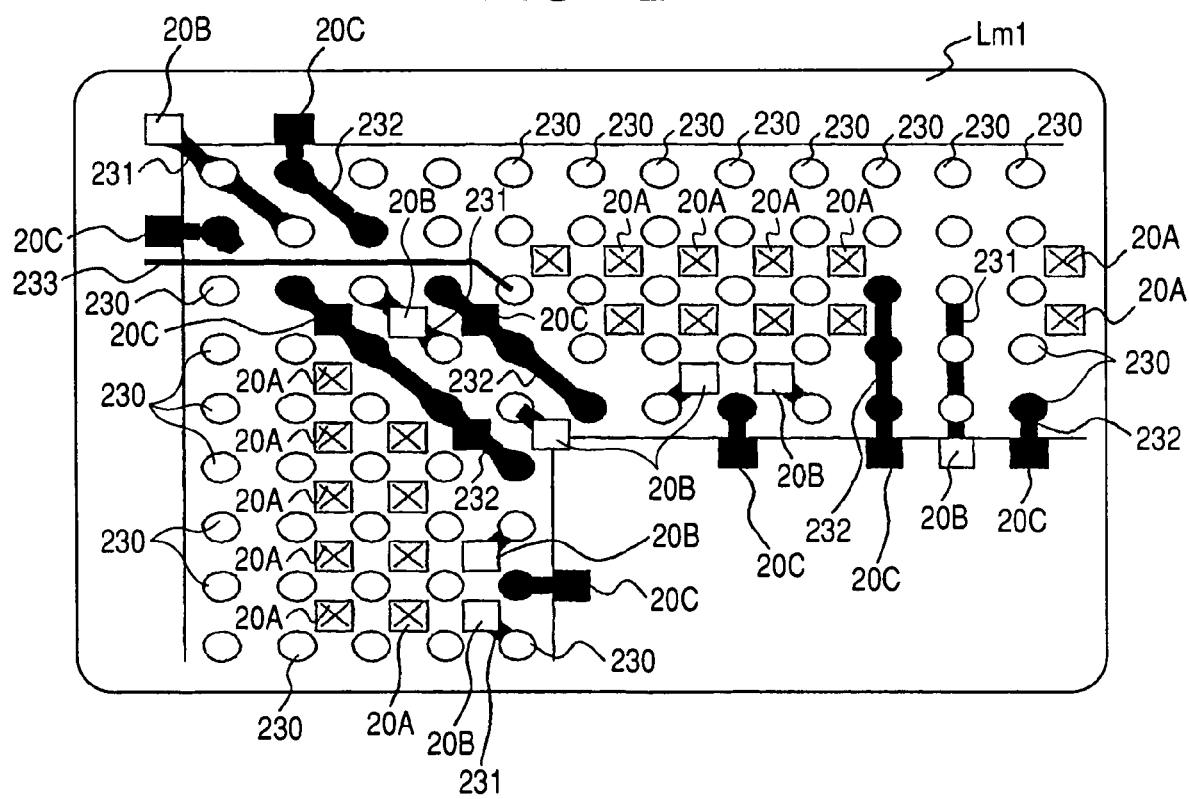
FIG. 22 is an explanatory view which illustrates a state of the power source lines and the ground lines of the conductive layer Lm1 corresponding to FIG. 20 and FIG. 21.

With respect to the arrangements of the vias, the power source lines and the like, the vias which penetrate the ground plane of the conductive layer Lm2 may be arranged in a state shown in FIG. 20, the vias which penetrate the power source plane of the conductive layer Lm3 may be arranged in a state shown in FIG. 21, and the power source lines and the ground lines of the conductive layer Lm1 may be arranged in a state shown in FIG. 22. In this case, it is possible to pull out the signal lines 233 across above the specified regions 213, 223 on the first conductive layer Lm1.

Figure 23:
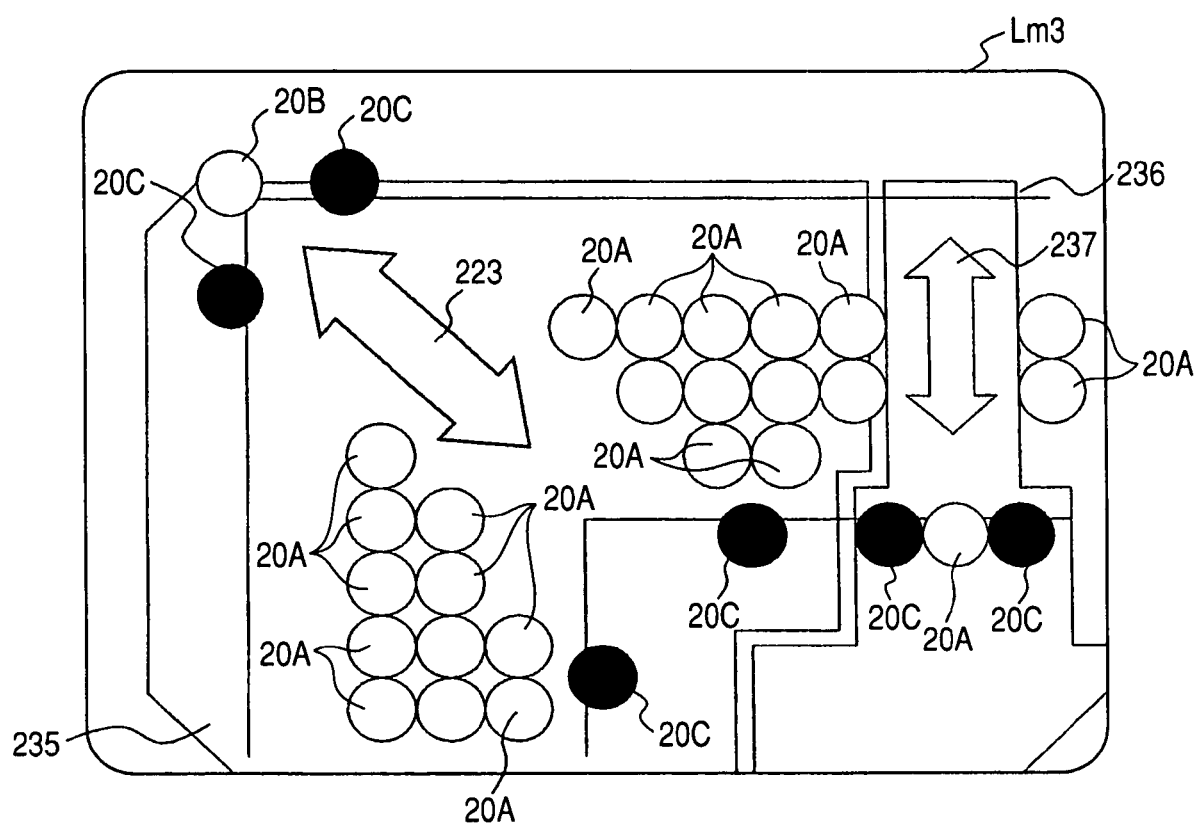
FIG. 23 is an explanatory view which illustrates a power source plane dividing mode of a third conductive layer Lm3.
Figure 24:
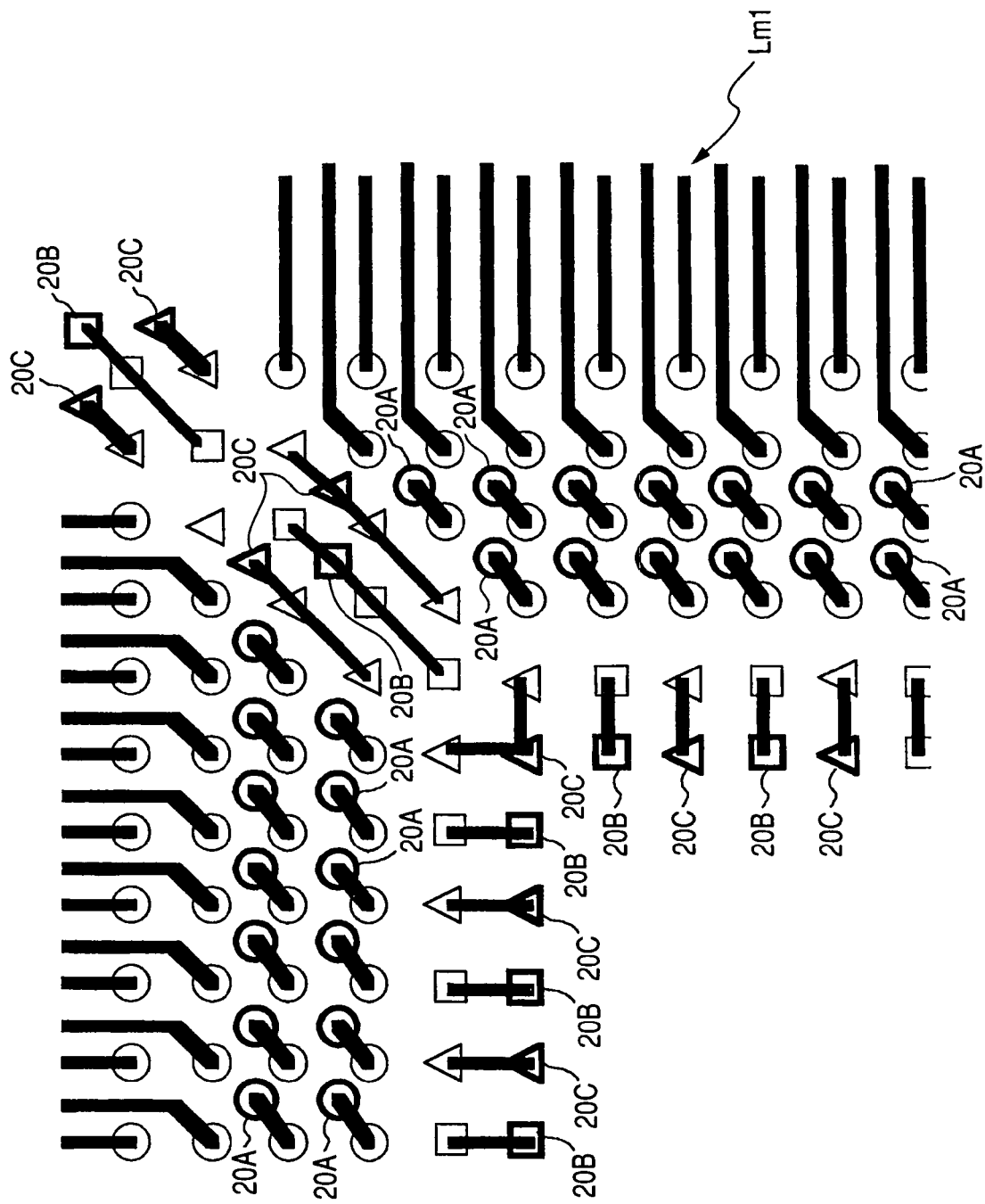
FIG. 24 is a plan view which illustrates another connection state of the mounting substrate and vias on a first conductive layer.
Figure 25:
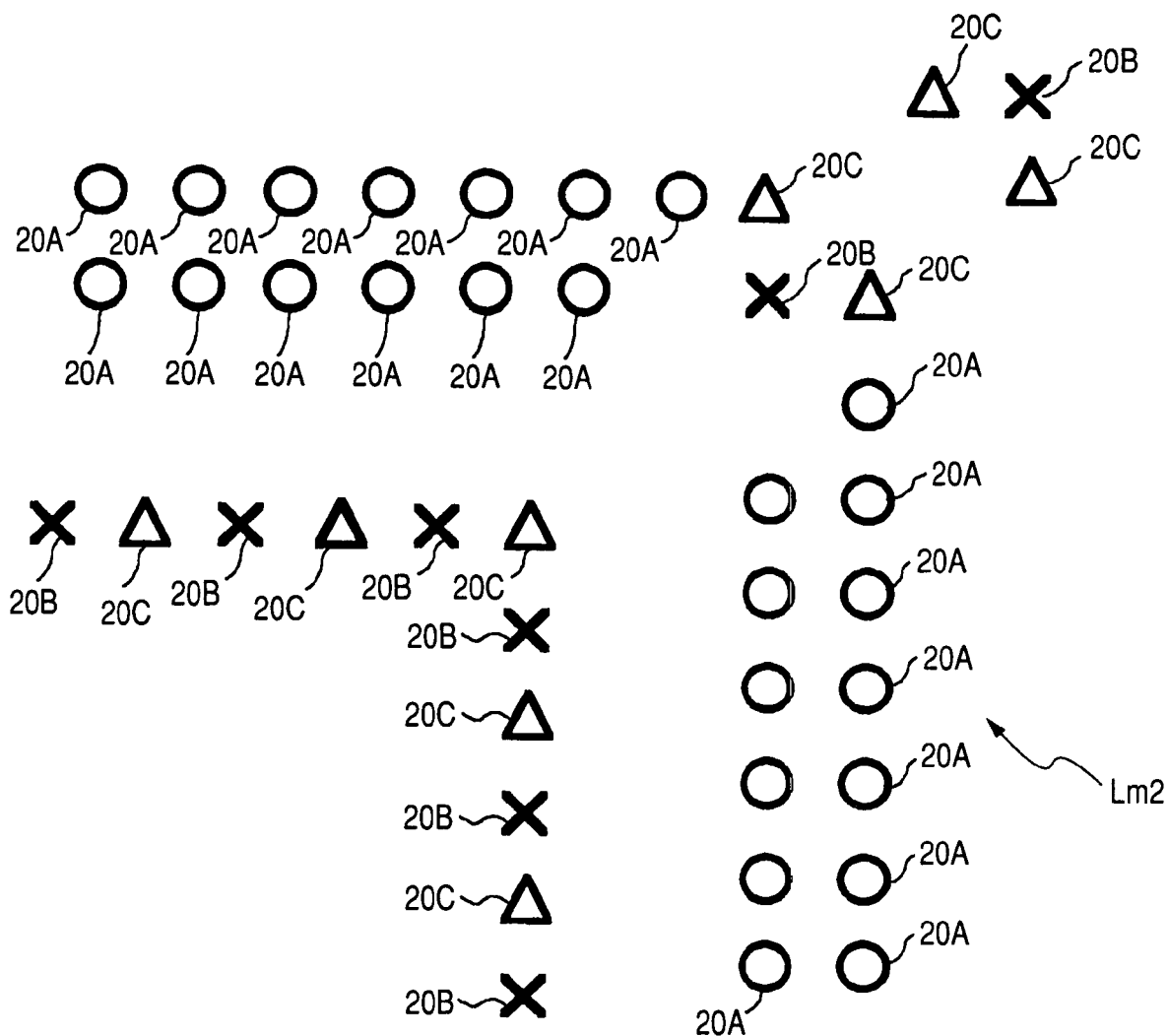
FIG. 25 is a plan view which illustrates another connection state of the mounting substrate and vias on a second conductive layer.
Figure 26:
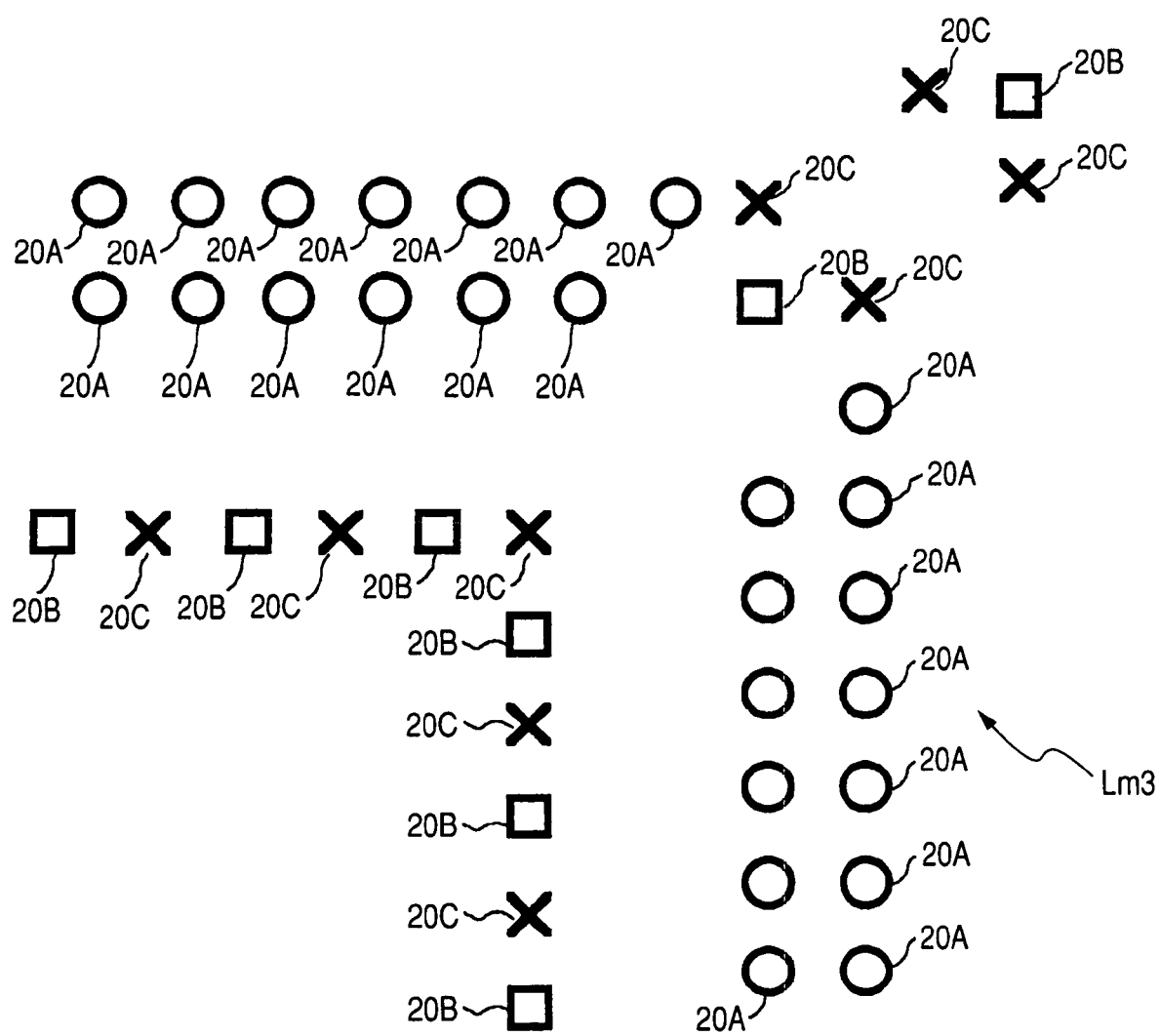
FIG. 26 is a plan view which illustrates another connection state of the mounting substrate and vias on a third conductive layer.
Figure 27:
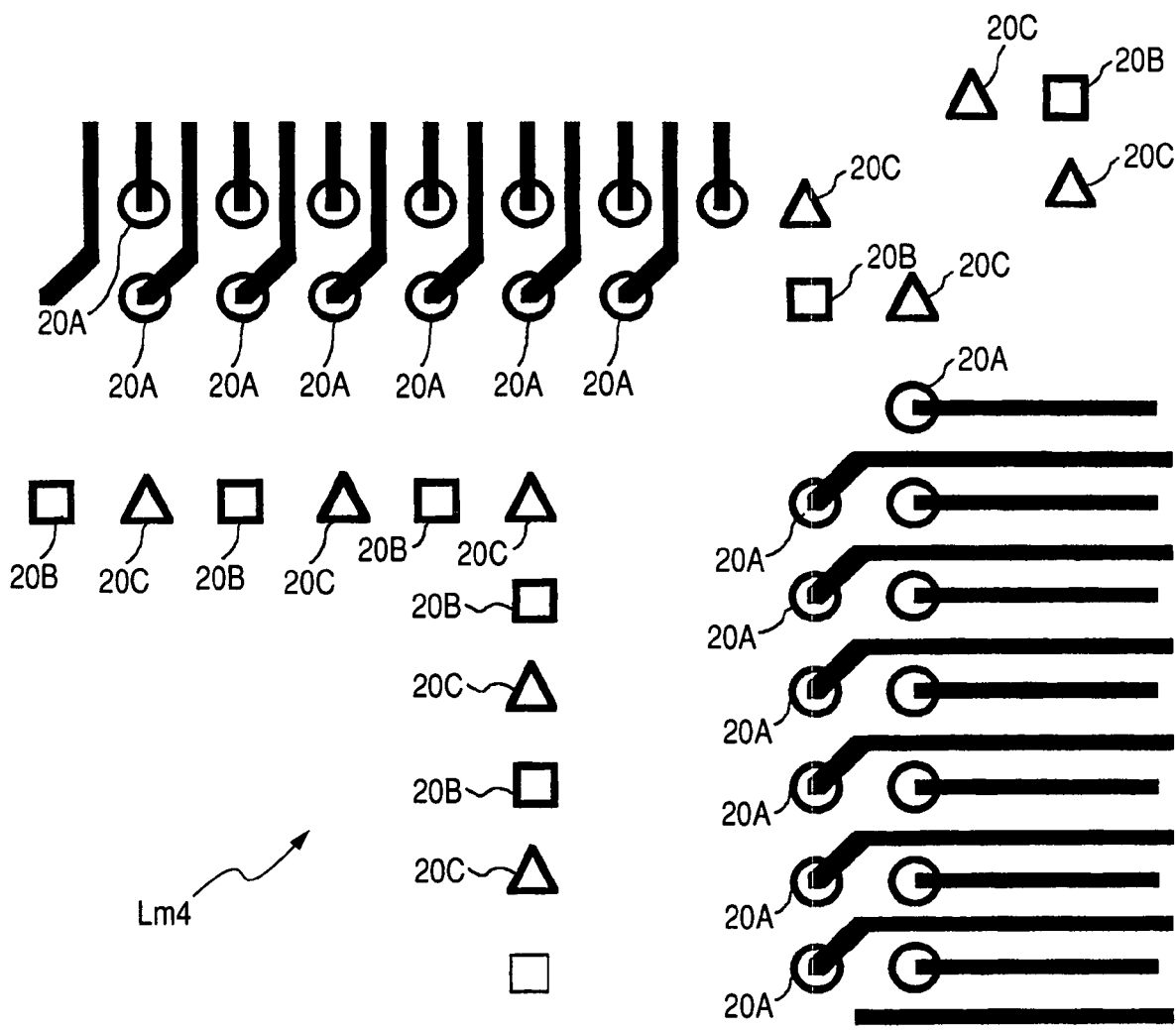
FIG. 27 is a plan view which illustrates another connection state of the mounting substrate and vias on a fourth conductive layer.

FIG. 23 illustrates a power source plane dividing mode of the third conductive layer Lm3. When the power source plane of the mounting substrate 2 is divided into a power source plane 235 for the SDRAM 4 and a core power source plane 236 of the data processor 3, a specified region 237 which is substantially similar to the above-mentioned specified region on a middle portion of a side of core division power source 236 maybe formed as well as in the corner portion of the mounting board.

FIG. 24 to FIG. 27 show connection states of the ground plane and the power plane of the mounting substrate with the vias on the first conductive layer to the fourth conductive layer of the mounting substrate as another examples. In respective drawings, symbol "square" indicate the ground vias 20B, symbol "triangle" indicates power source vias 20C, symbol "circle" indicates signal vias 20A, symbols "x" indicates the electrical connection between the vias with the ground plane and the power source plane.

<<Vref Wiring>>

Figure 28:
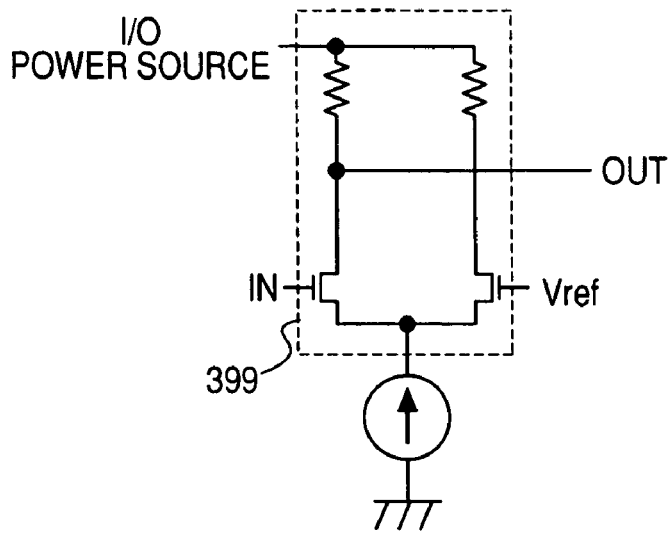
FIG. 28 is a circuit diagram which illustrates a determination circuit which performs a determination operation based on a reference potential Vref.
Figure 29:
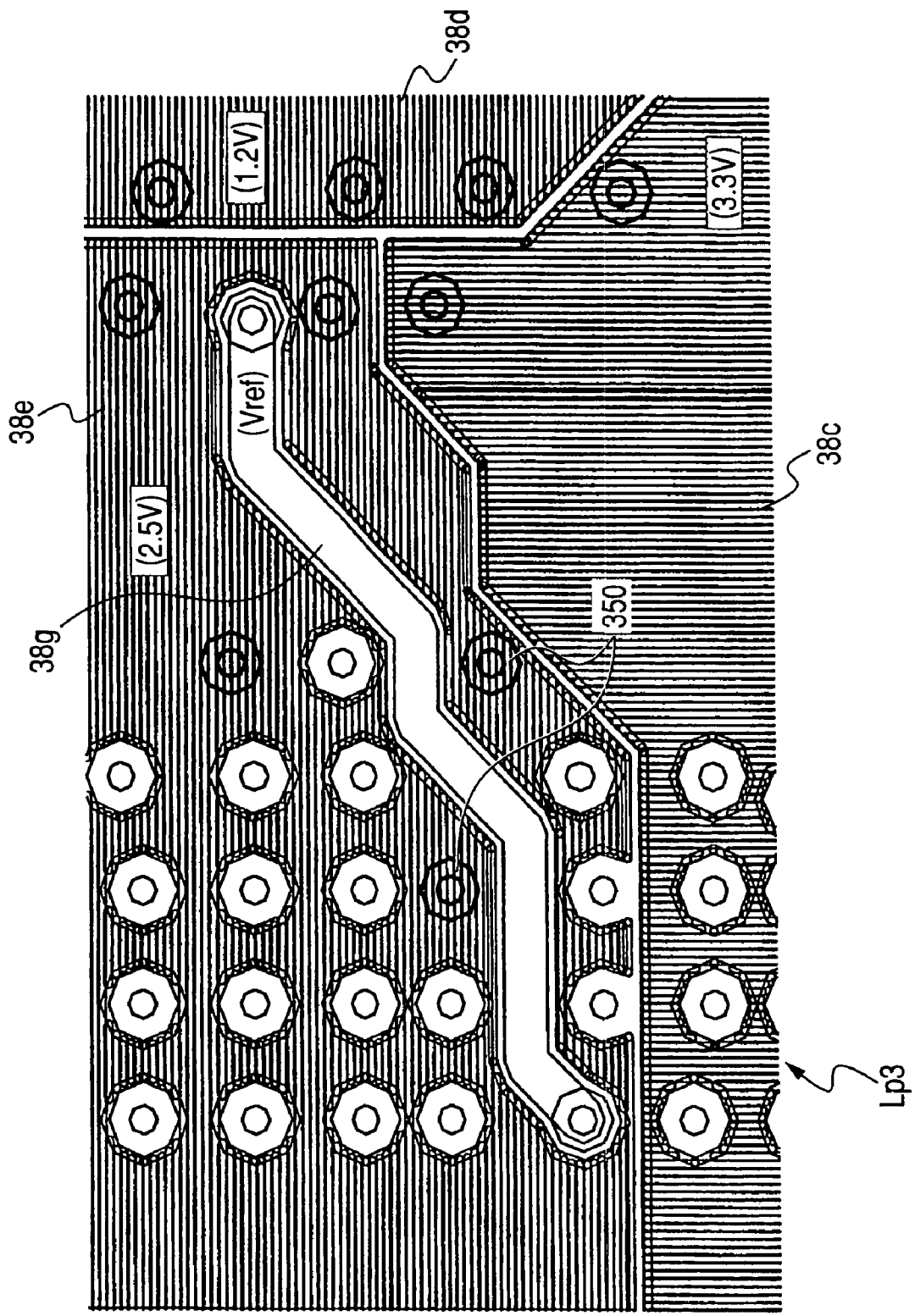
FIG. 29 is a plan view showing a layout mode of a power source plane for a reference potential Vref of a third conductive layer Lp3.
Figure 30:
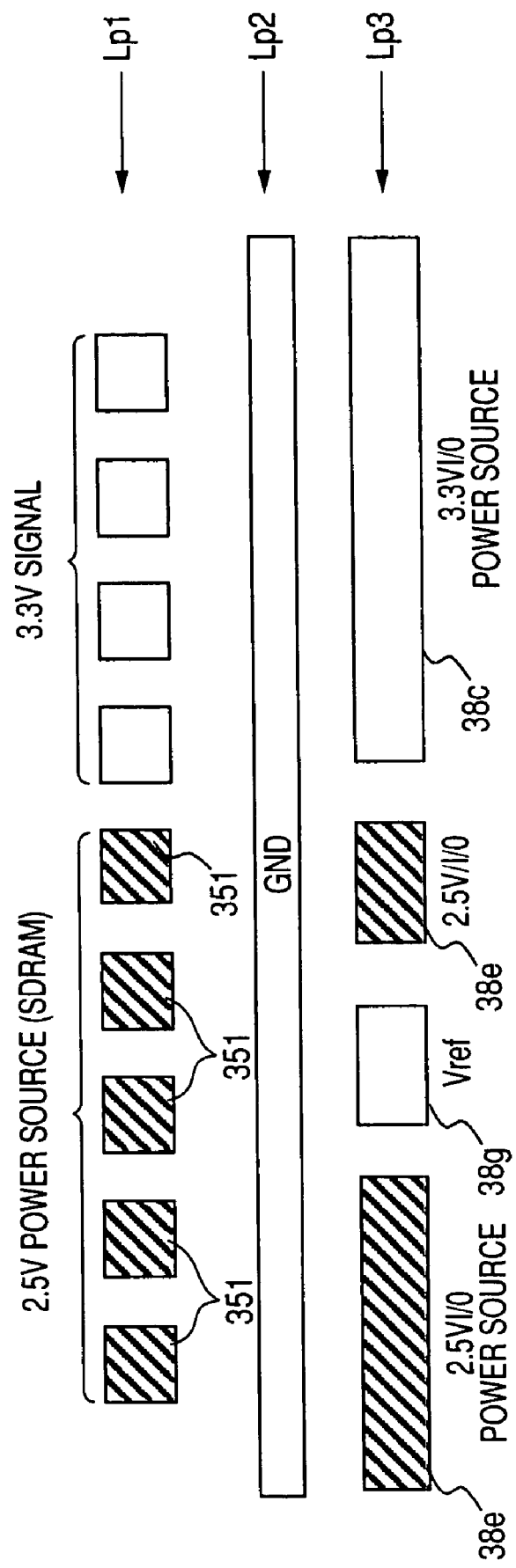
FIG. 30 is a schematic cross-sectional view showing a longitudinal cross-sectional structure in the vicinity of a reference potential wiring 38g.

To the data processor 3, although not particularly limited, a reference potential Vref is inputted from the outside. The reference potential Vref is used for the logical value determination of an input level in an input buffer such as a memory interface circuit 307, for example. The determination circuit 399 which performs the logical value determination is constituted of, for example, a differential input circuit shown in FIG. 28, for example. An I/O power source indicates the above-mentioned SDRAM interface power source of 2.5V. The reference potential Vref is set to 2.5V/2. The reference potential line 38g which supplies the reference potential on the package substrate 30 is, as shown in FIG. 4, arranged on the third conductive layer Lp3 on which the power source plane is formed in a state that the reference potential line 38g is surrounded by the SDRAM power source plane 38e. In more detail, as shown in FIG. 29 as an example, to the SDRAM power source plane 38e arranged on both sides of the reference potential line 38g, vias 350 with which the solder ball electrodes for supplying 2.5V are made conductive are joined and hence, the reference potential line 38g is electrically and strongly coupled the SDRAM power source of 2.5V in terms of potential. FIG. 30 shows a schematic longitudinal cross section in the vicinity of the reference potential line 38g. A ground plane is formed on an upper layer Lp2 of the reference potential line 38g. Accordingly, both of the SDRAM power source plane 38e and the reference potential line 38g are also coupled with the ground potential of the ground plane. Further, the reference potential line 38g is, by interposing the ground plane between the reference potential line 38g and the SDRAM signal lines 351 of the first conductive layer Lp1 which are connected to the address of the SDRAM 4 and the data terminals, prevented from capacitive coupling with the SDRAM signal line 351.

Figure 31:
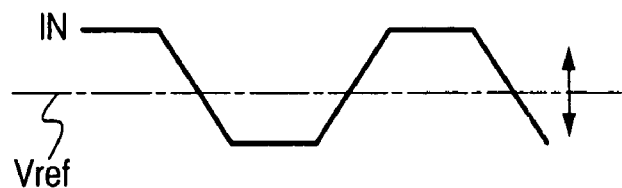
FIG. 31 is an explanatory view showing a change of a timing margin of a determination result signal OUT when a reference potential Vref which is a determination reference voltage for an input signal IN is changed.

Accordingly, even when the level of the power source plane 38e of the determination circuit 399 fluctuates, the reference potential line 38g tends to change a level thereof with the same phase as the fluctuation due to the capacitive coupling with the power source plane 38e. Further, the signal change on the SDRAM signal line 351 is not superposed on the reference potential line 38g by the capacitive coupling. As shown in FIG. 31, when the reference potential Vref which constitutes a determination reference voltage corresponding to the input signal IN changes, a timing margin of a determination result signal OUT which is obtained by the determination circuit 399 is undesirably worsened. However, it is possible to prevent the generation of such a phenomenon due to the constitution. Accordingly, it is possible to obtain high reliability in determining operation by the determination circuit 399.

<<PLL/DLL Clock Wiring>>

FIG. 32 shows one example of the CPG 343. The CPG 343 includes a first PLL circuit (PLL1) 361, a second PLL circuit (PLL2) 362 and a DLL circuit 363. A circuit module 364 which receives clock signals generated by the PLL circuit 361, the PLL circuit 362 and the DLL circuit 633 is formed of a circuit such as, for example, the ATAPI 323, the GPSBB 331, the MRYIF 307 or the like described above. To the CPG 343, clock signals which are generated by a quartz oscillator are inputted from clock pads XTAL, EXTAL of the processor chip 31 by way of an I/O buffers (I/O BUF) 365, 366. As the power sources of the PLL circuit 361, the PLL circuit 362 and the DLL circuit 633, VDDp1, VSSp1, VDDp2, VSSp2, VDDd, VSSd are supplied from respective dedicated power source pads and ground pads. To the I/O BUFs 365, 366, an I/O power source VDDio and an I/O ground potential of 3.3V are supplied.

Figure 33:
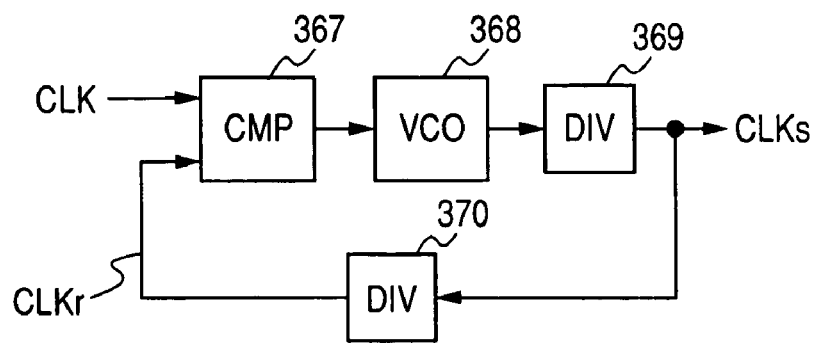
FIG. 33 is a block diagram which illustrates a basic circuit unit of a PLL.

FIG. 33 illustrates a basic circuit unit of the PLL circuit. The frequency of the input clock signal CLK is compared with the frequency of a feedback clock signal CLKr by a frequency comparator (CMP) 367 and a voltage signal which corresponds to the difference in the frequencies is formed. The voltage control oscillator (VCO) 368 oscillates using the voltage signal as a frequency control voltage. The oscillation frequency is divided in two using an output frequency divider 369 thus forming an output clock signal CLKs for a circuit of a succeeding stage and, at the same time, is divided by a frequency divider 370 and returned to the frequency comparator 367. Due to such a constitution, the clock signal CLKs is formed as a clock signal having a predetermined phase difference and a predetermined frequency dividing ratio with respect to the input clock signal CLK. The basic constitution of the DLL circuit has been explained along with the constitution of the SDRAM and hence, the repeated explanation is omitted here.

Figure 34:
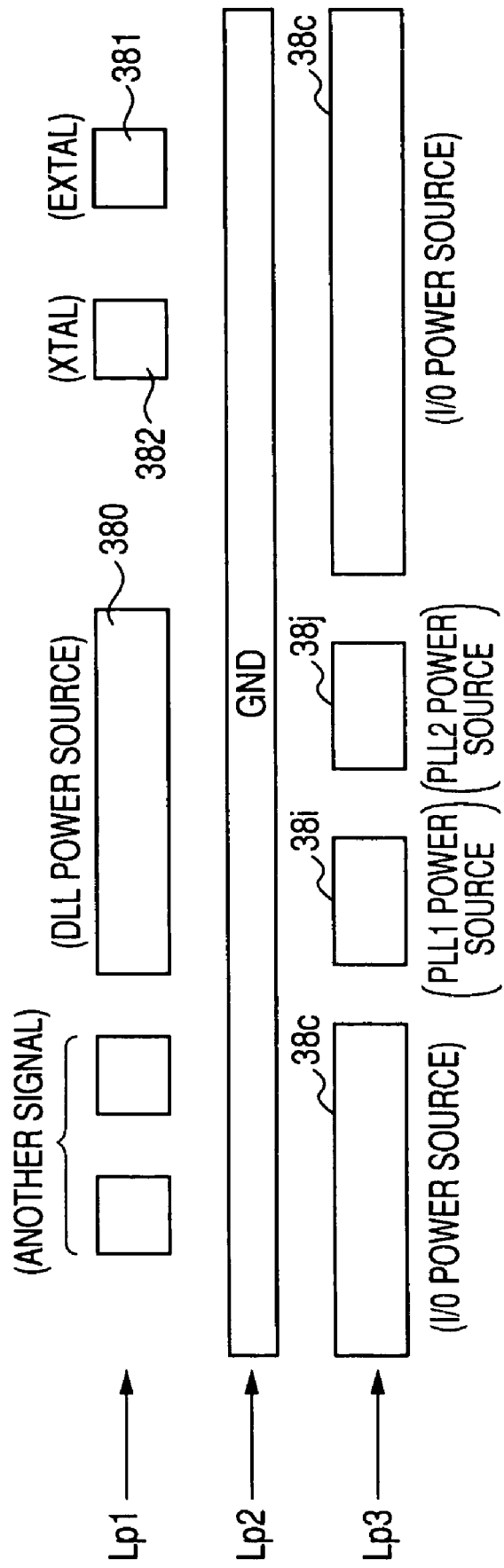
FIG. 34 is a cross-sectional view which illustrates a longitudinal cross-sectional structure of power source lines on a package substrate which supply an operational power source to a CPG of a processor chip.

FIG. 34 illustrates the longitudinal cross-sectional structure of the power source lines on the package substrate 30 which supply an operational power source to the CPG 343 of the processor chip 31. The first conductive layer Lp1 includes a power source line 380 which supplies a power source to the DLL circuit 363 and clock lines 381, 382 which supply clock signals to the PLL circuits 361, 362 and the DLL circuit 363. The power source line 380 and the clock lines 381, 382 are spaced apart from each other with an interval therebetween which is larger than the minimum interval size of the lines on the first conductive layer Lp1. For example, the power source line 380 and the clock lines 381, 382 are separated from each other with a distance twice as large as the thickness of an insulation film arranged between the first conductive layer Lp1 and the second conductive layer Lp2. Further, the power source lines 38i, 38j which supply a power source to the PLL circuits 361, 362 are formed on the third conductive layer Lp3 and the second conductive layer Lp2 is interposed between the clock lines 381, 382 at least in insulated manner. Accordingly, the clock lines 381, 382 are separated from the power source lines 38i, 38j which supply power sources to the PLL circuits 361, 362 and from the power source line 380 which supplies a power source to the DLL circuit 363 with a distance at least twice as large as the thickness of the interlayer insulation film of the conductive layers. Accordingly, it is possible to prevent the clock lines 381, 382 which the PLL circuits 361, 362 and the DLL circuit 363 of the processor chip 31 use and the operation power source line 380 thereof from being coupled with each other on the package substrate 30 and hence, it is possible to preliminarily prevent a phenomenon that the operational power source of the PLL circuits 361, 362 or the DLL circuit 363 fluctuates due to the coupling noises which are synchronized with an oscillation cycle of the clock thus preliminarily preventing the possibility of lowering of the synchronizing performance. This is because that, for example, in the voltage control oscillator or the current control oscillator which largely influences synchronizing performance in the PLL circuit or the DLL circuit, when the operation power source changes, the oscillation frequency is changed in response to the change of the operation power source.

Figure 35:
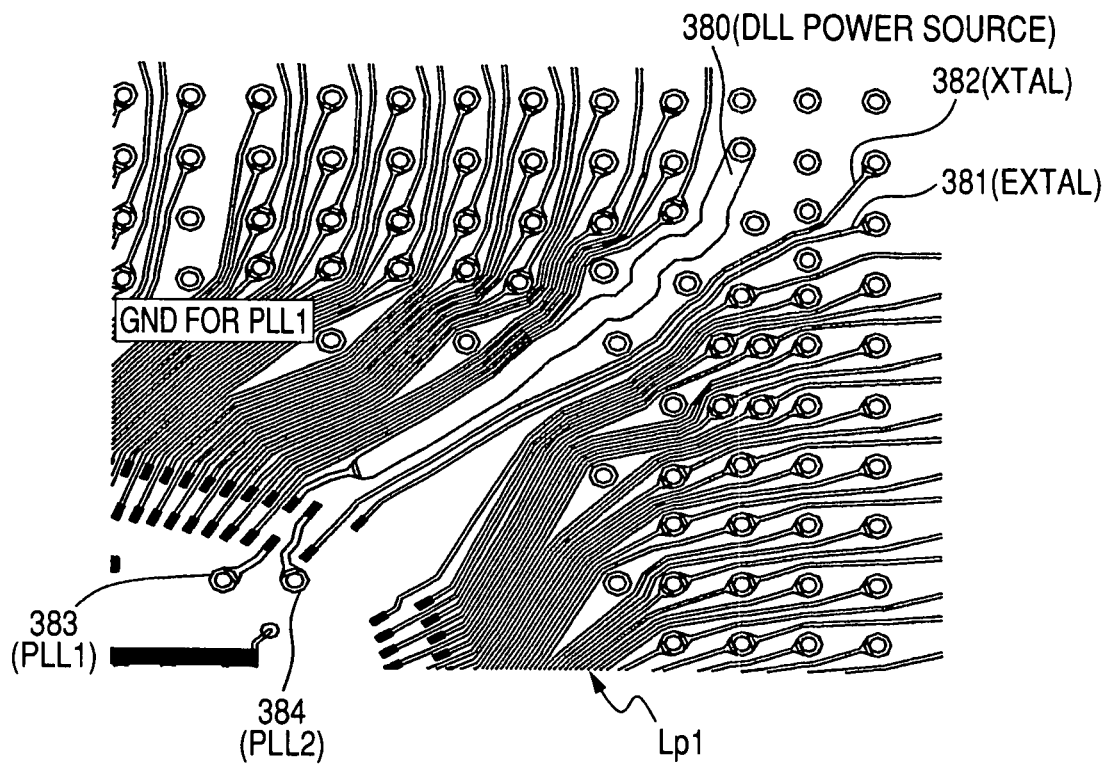
FIG. 35 is a plan view which illustrates a planner arrangement relationship between power source lines which supply power source to a DLL circuit and clock lines on the first conductive layer Lp1.

FIG. 35 illustrates a planar arrangement relationship between the power source line 380 which supplies power source to the DLL circuit 363 and the clock lines 381, 382 on the first conductive layer Lp1. The vias 383, 384 are made conductive with the power source lines 38i, 38j which supply power sources to the PLL circuits 361, 362.

Figure 36:
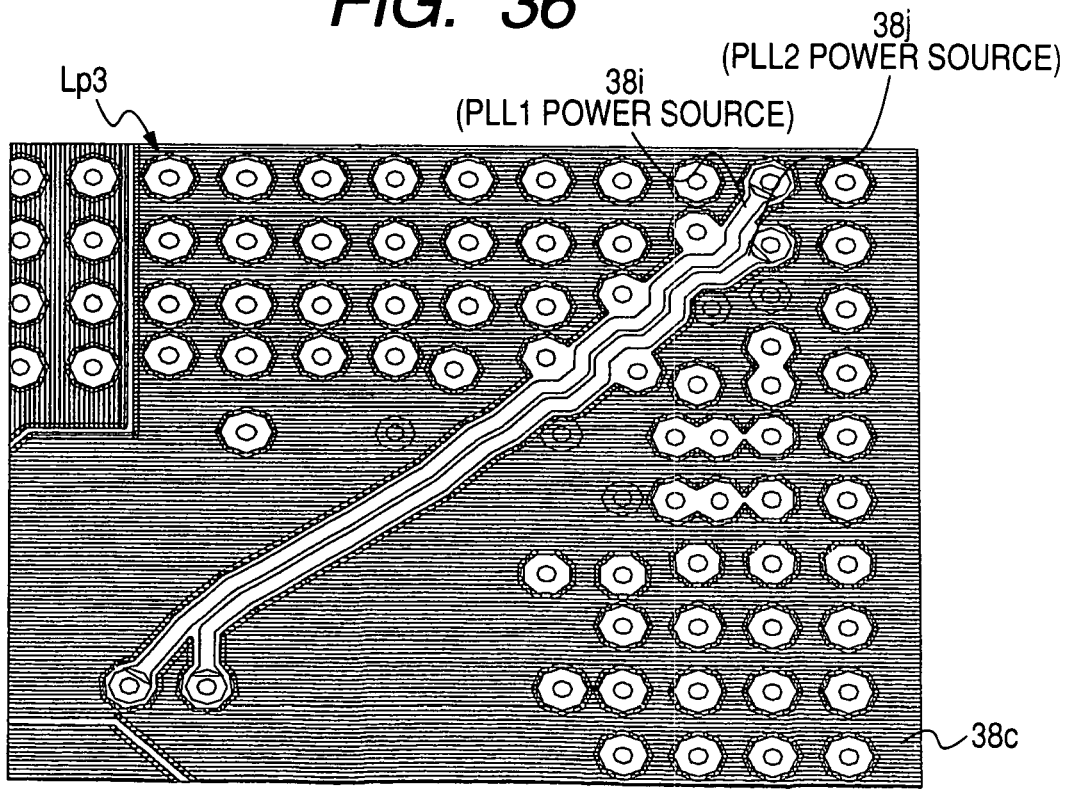
FIG. 36 is a plan view which illustrates a planner arrangement relationship of power source lines which supply power source to a PLL circuit on a third conductive layer Lp3.

FIG. 36 illustrates a planar arrangement relationship of the power source lines 38i, 38j which supply power sources to the PLL circuits 361, 362 on the third conductive layer Lp3. The power source lines 38i, 38j which supply power sources to the PLL circuits 361, 362 on the third conductive layer Lp3 are electrically independent from the surrounding power source plane 38c. Due to such a constitution, the PLL circuits 361, 362 are hardly influenced by the power source noises attributed to the operations of other circuits.

<<Separation of Power Source of Constant Current Source Circuit in DAC>>

Figure 37:
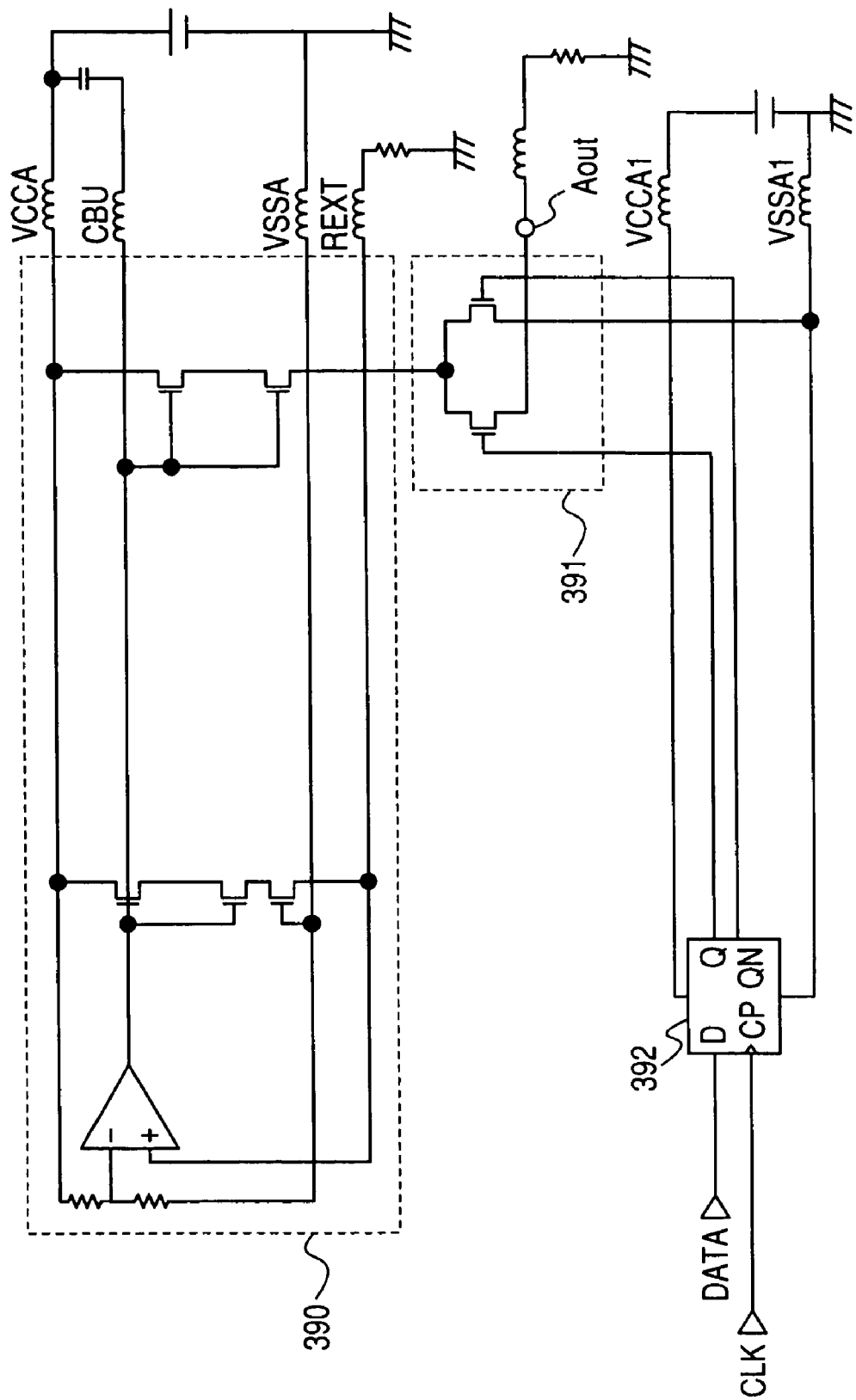
FIG. 37 is a circuit diagram which illustrates an essential part of a DAC.

FIG. 37 illustrates an essential part of DAC 334. Digital data of a plurality of bits is converted into a signal of a power of two corresponding to the bit number by a decoder which is not shown in the drawings. FIG. 37 shows a unit circuit of DA conversion for one converted signal. The DA conversion unit circuit includes a constant current source circuit 390, a switch 391 which controls whether a constant current from the constant current source circuit 390 is to be added to an output node Aout, and a flip-flop 392 which holds a switch control signal. The flip-flop 392 holds a decoded output from the above-mentioned decoder per 1 signal unit. The plurality of DA conversion unit circuits have an output terminal Aout in common, and a current corresponding to a value of the digital data is added to the output terminal Aout based on the decoded output from the decoder, and a voltage corresponding to the current value is outputted as a result of the digital-analog conversion via a current-voltage conversion circuit which is not shown in the drawings. The DAC 334 which is explained in conjunction with FIG. 37 is also adopted as a local DAC of the DAC which the GPSBB 331 includes for example.

An operational power source of the above-mentioned DAC334 is separated between the constant current source circuit 390 and the flip-flop 392. A power source voltage VCCA and a ground voltage VSSA are allocated to the constant current source circuit 390. A power source voltage VCCA1 and a ground voltage VSSA1 are allocated to the flip-flop 392. With respect to other circuits of DAC334, the power source voltage VCCA and the ground voltage VSSA are allocated to analog-system circuits, while the power source voltage VCCA1 and the ground voltage VSSA1 are allocated to digital-system circuits.

Figure 38:
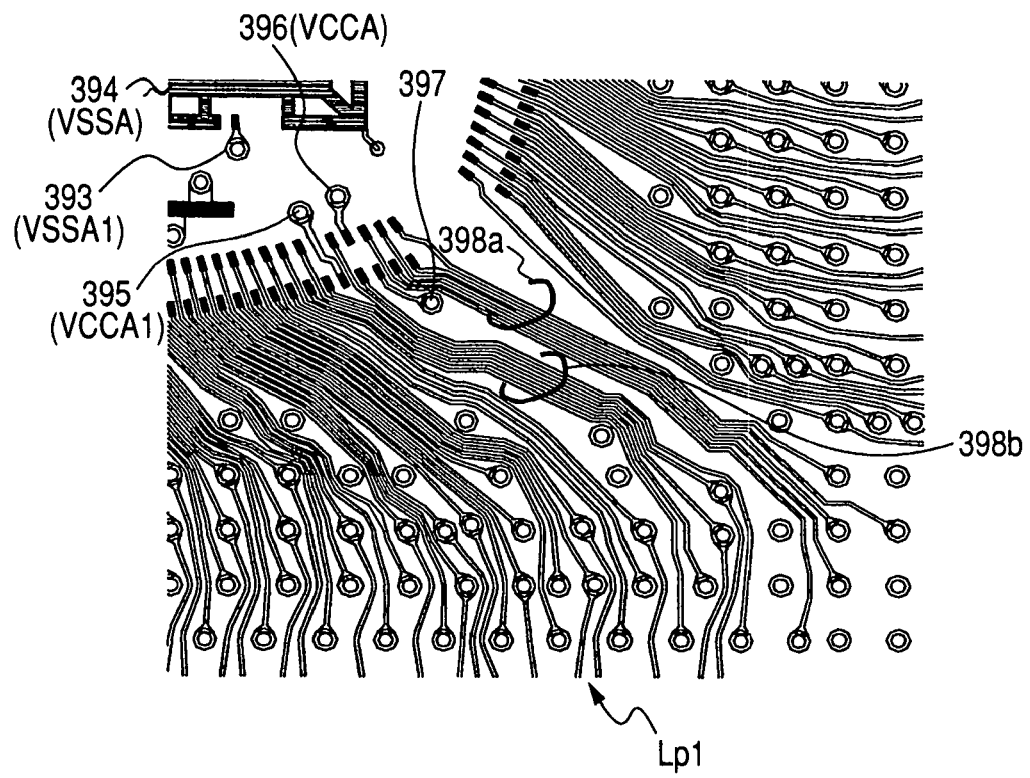
FIG. 38 is a plan view which illustrates a power source wiring pattern of the DAC, ADC on the first conductive layer Lp1.
Figure 40:
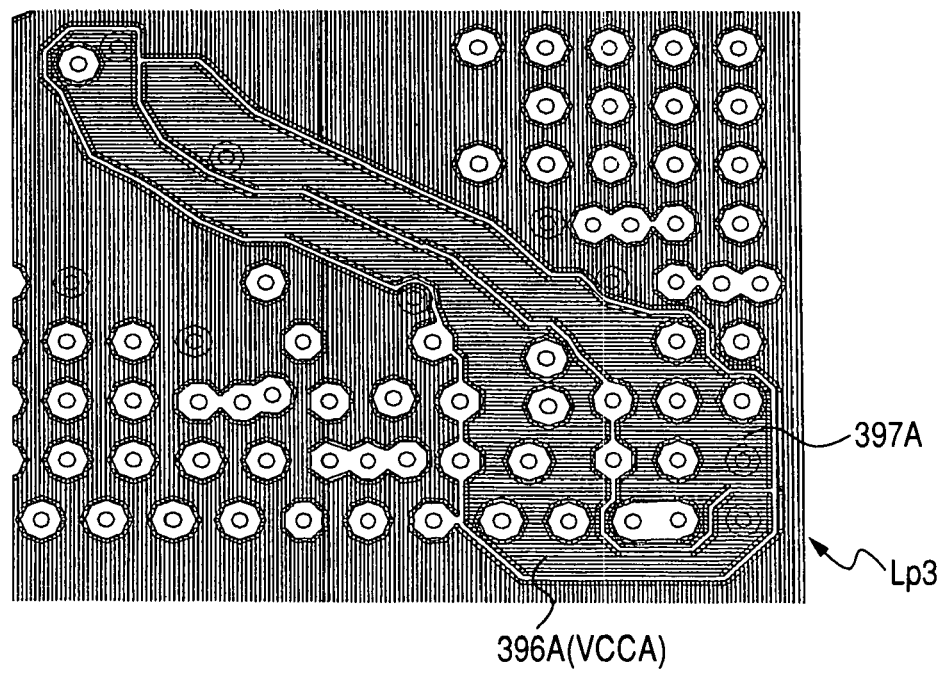
FIG. 40 is a plan view showing the power source plane on a third conductive layer Lp3 to which vias dedicated to a VCCA of the DAC are connected.
Figure 39:
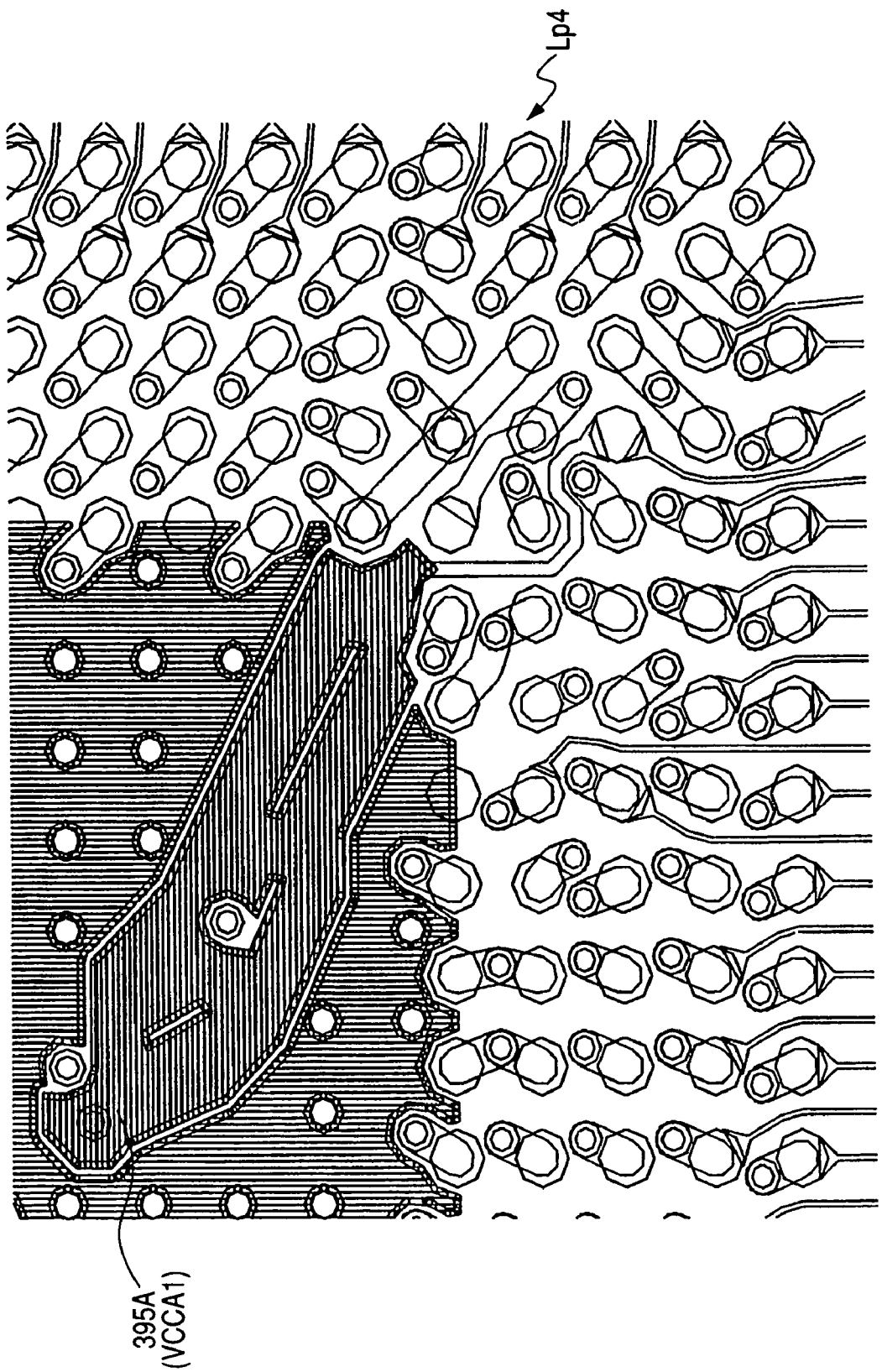
FIG. 39 is a plan view showing the power source plane on a fourth conductive layer Lp4 to which vias dedicated to a VCCA1 are connected.

FIG. 38 illustrates a power source wiring pattern of the DAC, ADC on a first conductive layer Lp1. Numeral 393 indicates a dedicated via for the VSSA1, and the dedicated via for the VSSA1 is connected to a ground plane of a second conductive layer Lp2. Numeral 394 indicates a ground line to which the VSSA or the like is supplied, and the ground line which the VSSA or the like is supplied also supplies a ground potential to other circuits, and is connected to the ground plane of the second conductive layer Lp2. Numeral 395 indicates a dedicated via for the VCCA1, and the dedicated via for the VCCA1 is connected to a power source plane 395A of a fourth conductive layer Lp4 which is illustrated in FIG. 39 and is made conductive with a dedicated solder ball electrode from the power source plane 395A. Numeral 396 indicates a dedicated via for the VCCA of the DAC, and the dedicated via for the VCCA of the DAC is connected to a dedicated power source plane 396A for the via in a third conductive layer Lp3 shown in FIG. 40 and is made conductive with a dedicated solder ball electrode through the power source plane 396A. Numeral 397 indicates a dedicated via for the VCCA of the ADC, and the dedicated via for the VCCA of the ADC is connected to a dedicated power source plane 397A for the via in the third conductive layer Lp3 shown in FIG. 40 and is made conductive with a dedicated solder ball electrode through the power source plane 397A. Accordingly, even when noises are generated from the power sources VCCA1, VSSA1 attributed to a switching operation of above-mentioned switch 391, the power source of the constant current source circuit 390 is, since the power sources of VCCA1, VSSA1 are separated from the power source of the constant current source circuit 390, not influenced and hence, the separation of power source contributes to the improvement of the conversion accuracy of the DAC as well as ADC.

The power source plane 396A of the VCCA which is formed on the above-mentioned third conductive layer Lp3 is assumed as the power source plane of the above-mentioned constant current source circuit 390, and the power source plane 395A which supplies the power source VCCA1 to the above-mentioned flip-flop 392 is separately formed on the above-mentioned fourth conductive layer Lp4 from the power source plane of the above-mentioned constant current source circuit 390. Accordingly, the power source of the constant current source circuit 390 is no more influenced by the switching noises and hence, the separation of power source contributes to the improvement of the conversion accuracy. Further, since the power source plane 396A which is formed on the above-mentioned third conductive layer Lp3 and the power source plane 395A of the above-mentioned switch control circuit which is formed on the above-mentioned fourth conductive layer are separately joined to connection end terminals mounting substrate which are electrically separated from each other, respectively, it is possible to further assure the above-mentioned effects.

In FIG. 38, numeral 398a indicates signal wiring of the ADC, and numeral 398b indicates the signal lines of the DAC, and both lines are separately arranged in a concentrated manner, respectively. On the third conductive layer Lp3 shown in FIG. 40, the power source plane 396A for the DAC is arranged at a position where the power source plane 396A is overlapped vertically to signal lines 398b for the DAC. In the same manner, the power source plane 397A for the ADC is arranged at a position where the power source plane 397A is substantially overlapped vertically to the signal lines 398a for the ADC. Accordingly, even when the DAC on a package substrate or the power source plane for the ADC is arranged independently from the power source planes of other circuits, when the power source plane for the DAC or the ADC fluctuates, the signal lines for the converter which are coupled with the power source plane have a level thereof changed with the same phase and hence, it is possible to suppress the lowering the conversion accuracy attributed to the power source fluctuation of the converter as much as possible.

Although, the invention which was made by the inventors of the present invention has been explained specifically in conjunction with the embodiments, the present invention is not limited to the above-mentioned embodiments and can be modified in various forms without departing from the gist of the present invention.

For example, the number of the layers of the package substrate and the mounting substrate is not limited to four, and may be four or more. In addition, the semiconductor device is not limited to the BGA-package structure. Further, the semiconductor device which is mounted on the mounting substrate is not limited to the data processor and the SDRAM, and may be a memory controller and a memory or a data processor and a liquid crystal driver or the like, respectively.

Further, with respect to the memory interface specifications, although in this embodiment, the explanation has been made with respect to the case in which the DDR-SDRAM is used. However, it is needless to say that the present invention is not limited to such a case, and the present invention is applicable to a system which adopts the interface specification for data transmission at a high transmission rate.

INDUSTRIAL APPLICABILITY

The present invention can be extensively applied to the various electronics circuits which mount the semiconductor device on the mounting substrate.

The invention claimed is:

1. An electronic circuit including a first semiconductor device and a second semiconductor device on a mounting substrate, wherein
the first semiconductor device includes external terminals of a plurality of bits,
the second semiconductor device includes external terminals of a plurality of bits, a semiconductor chip having a plurality of connecting electrodes, and assembling lines which connect the external terminals of a plurality of bits and the plurality of connecting electrodes of the semiconductor chip of the second semiconductor device,
the mounting substrate includes a plurality of mounting substrate lines which are connected in common with external terminals of a plurality of bits of the first semiconductor device and external terminals of a plurality of bits of the second semiconductor device for every bit,
the mounting substrate lines have lengths thereof from the external terminals of the first semiconductor device to the external terminals of the second semiconductor device made unequal for respective bits,
the assembling lines of the second semiconductor device have made lengths thereof unequal for respective bits, and
the unequal lengths of the mounting substrate lines have a relationship which offsets the unequal lengths of the assembling lines.

2. An electronic circuit according to claim 1, wherein the first semiconductor device is formed of a synchronous memory, the second semiconductor device is formed of a data processor which is capable of getting access to and controlling the synchronous memory, and the data processor performs parallel inputting/outputting of access data of a plurality of bits between the data processor and the synchronous memory via the mounting substrate lines.

3. An electronic circuit according to claim 2, wherein the external terminal of a plurality of bits of the synchronous memory has data inputting/outputting timing thereof synchronized with the clock signal, and the data processor acquires data outputted from the synchronous memory in synchronism with the clock signal which is outputted from the synchronous memory.

4. An electronic circuit according to claim 3, wherein the second semiconductor device includes the package structure in which a large number of solder ball electrodes are annularly formed on the package substrate in a plurality of rows as external terminals, wherein unequal lengths of the assembling lines in the inside of the package substrate have the difference integer times as large as a pitch in the row direction of the solder ball electrode.

5. An electronic circuit according to claim 1, wherein the first semiconductor device has lengths of the assembling lines thereof from the external terminals thereof to connection electrodes of the semiconductor chip made equal to each other.

6. An electronic circuit including a first semiconductor device and a second semiconductor device on a mounting substrate, wherein
the first semiconductor device includes external terminals of a plurality of bits,
the second semiconductor device includes external terminals of a plurality of bits, a semiconductor chip having a plurality of connecting electrodes, and assembling lines which connect the external terminals of a plurality of bits and the plurality of connecting electrodes of the semiconductor chip of the second semiconductor device,
the mounting substrate includes a plurality of mounting substrate lines which are connected in common with external terminals of a plurality of bits of the first semiconductor device and external terminals of a plurality of bits of the second semiconductor device for every bit,
the mounting substrate lines have lengths thereof from the external terminals of the first semiconductor device to the external terminals of the second semiconductor device made unequal for respective bits,
the assembling lines of the second semiconductor device have made lengths thereof unequal for respective bits, and
the unequal lengths of the mounting substrate lines have a relationship which offsets the unequal lengths of the assembling lines.

7. A semiconductor device according to claim 6, wherein
the semiconductor chip includes a determination circuit which performs a determination operation using a reference potential supplied from a predetermined pad electrode,
the package substrate includes a first conductive layer which is used for the connection with the pad electrodes of the semiconductor chip, a second conductive layer which is used as a ground plane, a third conductive layer which is used as a power source plane, and a fourth conductive layer which is used for the connection with the mounting substrate, and
the third conductive layer includes a power source plane which is connected with the determination circuit and lines for the reference potential, wherein the lines for the reference potential are arranged in a state that the lines for the reference potential are surrounded by the power source plane.

8. An electronic circuit according to claim 7, wherein
the ground plane and the power source plane include specified regions where via holes or through holes are not formed in a penetrating manner with a width equal to or larger than one pitch of external terminals which are arranged on the semiconductor device.

9. An electronic circuit according to claim 8, wherein the first semiconductor device is constituted of a plurality of semiconductor memory devices, and the second semiconductor device is a semiconductor control device which is capable of getting access to and controlling the semiconductor memory devices, wherein
the mounting substrate includes a power source plane of a terminating power source for terminating lines which connect the semiconductor memory devices and the semiconductor control device by way of terminating resistances,
the semiconductor memory devices are mounted closer to the power source plane of the terminating power source than the semiconductor control device,
to the power source plane of the terminating power source, terminating resistances which are connected with the lines and a plurality of first stabilizing capacities which are arranged close to the terminating resistances are connected in a dispersed manner, and
a second stabilizing capacity which is larger than the first stabilizing capacities is connected to an end portion of the power source plane remote from the supply end which supplies the terminating power source.

10. An electronic circuit according to claim 9, wherein among the lines, the one-way lines having a branch to which a plurality of semiconductor memory devices are connected in common, include lines which have terminating resistances thereof joined to the route having the longer route length starting from the semiconductor control device and lines which have terminating resistances thereof joined to the shorter route in mixture, and
a maximum value of the difference of the route length between the longer route in the one-way line which has the terminating resistance thereof joined to the shorter route and the shorter route is set to a minimum value or less of the difference of the route length between the shorter route in the one-way line which has the terminating resistance thereof joined to the longer route and the longer route.

11. An electronic circuit according to claim 10, wherein the semiconductor control device includes a semiconductor chip mounted on a package substrate,
the semiconductor chip includes a phase locked loop circuit or a delay locked loop circuit,
the first conductive layer of the package substrate is used for connection with pad electrodes of the semiconductor chip, and
the first conductive layer includes a power source line which supplies a power source to the phase locked loop circuit or the delay locked loop circuit, and clock lines which supply clock signals to the phase locked loop circuit or the delay locked loop circuit, wherein the power source line and the clock line are spaced apart from each other with a distance larger than a minimum distance size of lines in the first conductive layer.

12. An electronic circuit according to claim 11, wherein the semiconductor chip includes converters of either one or both of a digital analog converter and an analog digital converter,
on the third conductive layer, power source planes for the converters are separated from the power source plane for other circuits, and
on the first conductive layer, signal lines for converters are formed at positions where the signal lines for converters are overlapped to the power source plane for the converters.

13. An electronic circuit according to claim 12, wherein the digital analogue converter includes a circuit which adds a constant current from the constant current source circuit to an output node using a switch,
the semiconductor chip includes a first analog power source terminal and a first analog ground terminal for the constant current source circuit and a second analog power source terminal and a second analog ground terminal for the switch control circuit respectively in a separated manner,
the first analog ground terminal and the second analog ground terminal are connected to analog grounding lines which are separately formed on the first conductive layer, and the respective analog ground lines are connected to the ground plane of the second conductive layer in common, and
the first analog power source terminal and the second analog power source terminal are separately connected to terminals of the fourth conductive layer from the respectively intrinsic analog power source lines which are formed on the first conductive layer via the respective power source planes.

* * * * *